United States Patent
Hsu et al.

(10) Patent No.: US 9,876,139 B2
(45) Date of Patent: *Jan. 23, 2018

(54) LIGHT-EMITTING DEVICE

(71) Applicant: EPISTAR CORPORATION, Hsinchu (TW)

(72) Inventors: Tzu-Chieh Hsu, Hsinchu (TW); Ching-San Tao, Hsinchu (TW); Chen Ou, Hsinchu (TW); Min-Hsun Hsieh, Hsinchu (TW); Chao-Hsing Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/345,185

(22) Filed: Nov. 7, 2016

(65) Prior Publication Data

US 2017/0054056 A1    Feb. 23, 2017

Related U.S. Application Data

(63) Continuation of application No. 14/589,683, filed on Jan. 5, 2015, now Pat. No. 9,530,940, which is a (Continued)

(30) Foreign Application Priority Data

Oct. 19, 2005   (TW) .............................. 094136605 A

(51) Int. Cl.
*H01L 33/10*    (2010.01)
*H01L 33/22*    (2010.01)
(Continued)

(52) U.S. Cl.
CPC ............ *H01L 33/105* (2013.01); *H01L 33/22* (2013.01); *H01L 33/382* (2013.01);
(Continued)

(58) Field of Classification Search
CPC ..... H01L 33/105; H01L 33/22; H01L 33/382; H01L 33/405; H01L 33/42; H01L 33/10
See application file for complete search history.

(56) References Cited

U.S. PATENT DOCUMENTS 5,414,281 A    5/1995   Watabe et al.
5,526,449 A    6/1996   Meade
(Continued)

FOREIGN PATENT DOCUMENTS

CN    1971955 A     5/2007
TW    461124        10/2001
(Continued)

*Primary Examiner* — Mary Ellen Bowman
(74) *Attorney, Agent, or Firm* — Muncy, Geissler, Olds & Lowe, P.C.

(57) ABSTRACT

A light-emitting device, comprises a light-emitting stacked layer comprising a first conductivity type semiconductor layer; a light-emitting layer formed on the first conductivity type semiconductor layer; and a second conductivity type semiconductor layer formed on the light-emitting layer and comprising a first plurality of cavities; a first dielectric layer formed on a first part of the second conductivity type semiconductor layer; a first transparent conductive oxide layer formed on the first dielectric layer and on a second part of the second conductivity type semiconductor layer, the first transparent conductive oxide layer including a first portion in contact with the first dielectric layer and including a second portion in contact with the upper surface of the second conductivity type semiconductor layer; a first electrode formed on the first portion; and a first reflective metal layer formed between the first transparent conductive oxide layer and the first electrode.

20 Claims, 20 Drawing Sheets

Related U.S. Application Data continuation-in-part of application No. 13/934,049, filed on Jul. 2, 2013, now Pat. No. 8,928,022, which is a continuation-in-part of application No. 13/772,149, filed on Feb. 20, 2013, now Pat. No. 8,866,174, which is a continuation of application No. 12/753,551, filed on Apr. 2, 2010, now Pat. No. 8,405,106, which is a continuation-in-part of application No. 11/581,439, filed on Oct. 17, 2006, now abandoned.

(51) Int. Cl.
    *H01L 33/38*     (2010.01)
    *H01L 33/40*     (2010.01)
    *H01L 33/42*     (2010.01)

(52) U.S. Cl.
    CPC ............ *H01L 33/405* (2013.01); *H01L 33/42* (2013.01); *H01L 33/10* (2013.01)

(56) References Cited

U.S. PATENT DOCUMENTS

| | | | |
|---|---|---|---|
| 5,779,924 A | 7/1998 | Krames et al. |
| 6,078,064 A | 6/2000 | Ming-Jiunn et al. |
| 6,277,665 B1 | 8/2001 | Ma et al. |
| 6,329,748 B1 | 12/2001 | Kastalsky et al. |
| 6,420,735 B2 | 7/2002 | Kim |
| 6,441,403 B1 | 8/2002 | Chang et al. |
| 6,495,862 B1 | 12/2002 | Okazaki et al. |
| 6,504,180 B1 | 1/2003 | Heremans et al. |
| 6,831,302 B2 | 12/2004 | Erchak |
| 6,859,477 B2 | 2/2005 | Deppe |
| 6,918,946 B2 | 7/2005 | Korgel |
| 7,180,178 B2 | 2/2007 | Takashima et al. |
| 7,244,957 B2 | 7/2007 | Nekajo Et El |
| 7,291,865 B2 | 11/2007 | Kojima et al. |
| 7,355,210 B2 | 4/2008 | Ou et al. |
| 7,385,226 B2 | 6/2008 | Ou et al. |
| 7,504,667 B2 | 3/2009 | Fujikura et al. |
| 7,567,342 B2 | 7/2009 | Reinhold |
| 8,063,557 B2 | 11/2011 | Hsieh et al. |
| 8,123,859 B2 | 2/2012 | Schowalter |
| 8,179,034 B2 | 5/2012 | Potts |
| 8,248,305 B2 | 8/2012 | Curran |
| 2002/0145148 A1 | 10/2002 | Okuyama et al. |
| 2002/0179918 A1 | 12/2002 | Sung et al. |
| 2003/0047745 A1 | 3/2003 | Suzuki et al. |
| 2003/0119218 A1 | 6/2003 | Jang |
| 2003/0218179 A1 | 11/2003 | Koide et al. |
| 2004/0012328 A1 | 1/2004 | Arnold |
| 2004/0189184 A1 | 9/2004 | Yasuda |
| 2005/0001227 A1 | 1/2005 | Niki et al. |
| 2005/0104080 A1 | 5/2005 | Ichihara et al. |
| 2005/0211995 A1 | 9/2005 | Ou et al. |
| 2005/0224822 A1 | 10/2005 | Liu |
| 2005/0236636 A1 | 10/2005 | Hon |
| 2005/0285136 A1 | 12/2005 | Ou et al. |
| 2005/0287687 A1 | 12/2005 | Liao et al. |
| 2006/0071226 A1 | 4/2006 | Kojima et al. |
| 2006/0076571 A1 | 4/2006 | Hsieh et al. |
| 2006/0267027 A1 | 11/2006 | Lai |
| 2007/0200493 A1 | 8/2007 | Hsu |
| 2008/0054278 A9 | 3/2008 | Ou et al. |
| 2008/0135868 A1 | 6/2008 | Okagawa et al. |
| 2009/0078951 A1 | 3/2009 | Miki et al. |
| 2009/0278233 A1 | 11/2009 | Pinnington |
| 2010/0047522 A1 | 2/2010 | Sivarajan |
| 2010/0052000 A1 | 3/2010 | Ko |
| 2010/0135937 A1 | 6/2010 | O'Brien |
| 2010/0276720 A1 | 11/2010 | Wong |
| 2011/0095342 A1 | 4/2011 | Daniel |
| 2012/0132930 A1 | 5/2012 | Young |

FOREIGN PATENT DOCUMENTS

| | | |
|---|---|---|
| TW | 200717843 | 10/2005 |
| WO | WO2006038665 | 4/2006 |

LIGHT-EMITTING DEVICE

REFERENCE TO RELATED APPLICATION

This application is a Continuation of application Ser. No. 14/589,683, entitled "LIGHT-EMITTING DEVICE WITH HIGH LIGHT EXTRACTION" filed Jan. 5, 2015, which is a Continuation-in-part of application Ser. No. 13/934,049, entitled "LIGHT-EMITTING DEVICE" now U.S. Pat. No. 8,928,022 which issued on Jan. 6, 2015, which is a Continuation-in-part of application Ser. No. 13/772,149, entitled "LIGHT-EMITTING DEVICE" now U.S. Pat. No. 8,866,176 which issued on Oct. 21, 2014, which is a Continuation of application Ser. No. 12/753,551, entitled "LIGHT-EMITTING DEVICE" now U.S. Pat. No. 8,405,106, which issued on Mar. 26, 2013, which is a Continuation-in-Part of application Ser. No. 11/581,439 entitled "LIGHT-EMITTING APPARATUS COMPRISING CAVITIES IN A TRANSPARENT CONDUCTIVE OXIDE LAYER" filed on Oct. 17, 2006, now abandoned, the entire contents of all of which are hereby incorporated by reference.

BACKGROUND

Technical Field

This application relates to a light-emitting diode device, and more particularly to a light-emitting diode device with high light extraction.

Description of the Related Art

Light-emitting diode (LED) devices are widely used in different fields such as displays, traffic lights, data storage apparatus, communication apparatus, lighting apparatus, and medical apparatus. One important task for engineers is to increase the brightness of the LED devices.

In a known LED device, the semiconductor layer of the LED device having a textured surface can have higher light extraction efficiency. However, the textured surface can lower lateral current conduction and current spreading so the forward voltage is higher.

SUMMARY

A light-emitting device, comprises: a light-emitting stacked layer comprising a first conductivity type semiconductor layer; a light-emitting layer formed on the first conductivity type semiconductor layer; and a second conductivity type semiconductor layer formed on the light-emitting layer and comprising a first plurality of cavities such that an upper surface of the second conductivity type semiconductor layer is a textured surface; a first dielectric layer formed on a first part of the second conductivity type semiconductor layer; a first transparent conductive oxide layer formed on the first dielectric layer and on a second part of the second conductivity type semiconductor layer, the first transparent conductive oxide layer including a first portion in contact with the first dielectric layer and including a second portion in contact with the upper surface of the second conductivity type semiconductor layer; a first electrode formed on the first portion of the first transparent conductive oxide layer; and a first reflective metal layer formed between the first transparent conductive oxide layer and the first electrode.

BRIEF DESCRIPTION OF THE DRAWINGS

The accompanying drawings are included to provide easy understanding of the application, and are incorporated herein and constitute a part of this specification. The drawings illustrate embodiments of the application and, together with the description, serve to illustrate the principles of the application.

DETAILED DESCRIPTION OF THE PREFERRED EMBODIMENTS

Figure 1A:
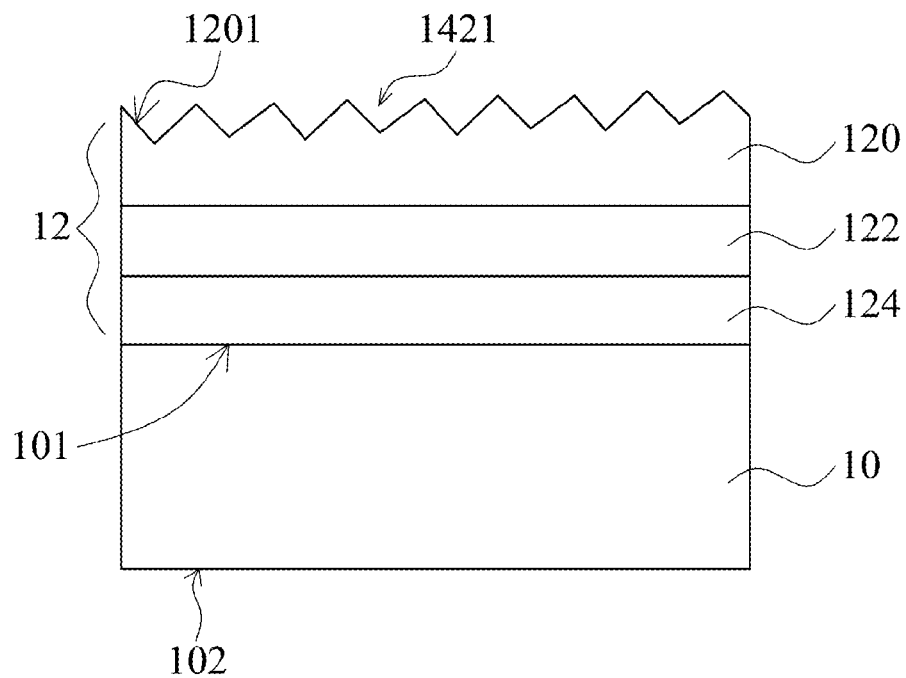
FIGS. 1A to 1F illustrate a process flow of a method of fabricating a light emitting device in accordance with a first embodiment of the present application.

Reference is made in detail to the preferred embodiments of the present application, examples of which are illustrated in the accompanying drawings. Wherever possible, the same reference numbers are used in the drawings and the description to refer to the same or like parts.

The present disclosure describes a light emitting device and a method of fabricating the light emitting device. In order to have a thorough understanding of the present disclosure, please refer to the following description and the illustrations of FIG. 1A to FIG. 7.

FIGS. 1A to 1F illustrate a process flow of the method of fabricating a light emitting device in accordance with a first embodiment of the present application. Referring to FIG. 1A, a light-emitting device comprises a conductive substrate 10; a light emitting stack 12 including a first conductivity type semiconductor layer 124, a light-emitting layer 122 and a second conductivity type semiconductor layer 120 sequentially formed on the first surface 101 of the conductive substrate 10. The second conductivity type semiconductor layer 120 comprises a first plurality of cavities 1421 formed by epitaxy method, etching method, or the combination thereof and thus the exposed upper surface 1201 of the second conductivity type semiconductor layer 120 is a textured surface. The material of the light emitting stack 12 contains one or more elements selected from the group consisting of Ga, Al, In, As, P, N and Si, such as aluminum gallium indium phosphide (AlGaInP) series material, aluminum gallium indium nitride (AlGaInN) series material and so on. The light-emitting layer 122 can be a single heterostructure (SH), a double heterostructure (DH), a double-side double heterostructure (DDH), or a multi-quantum well (MWQ). Besides, the wavelength of the emitted light can also be adjusted by changing the material and the thickness of the quantum well.

Figure 1B:
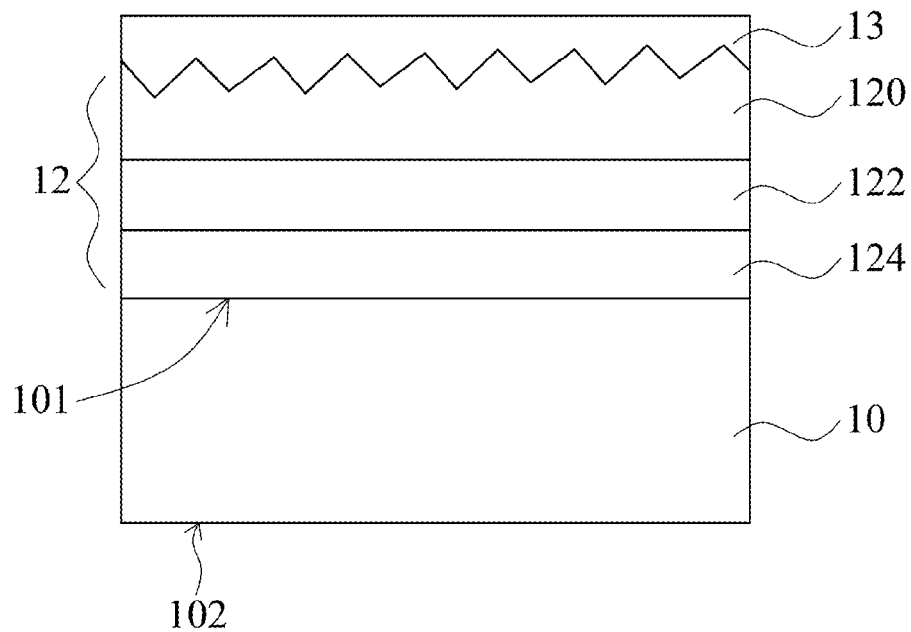

Referring to FIG. 1B, a first planarization layer 13 is formed to fill a part of the first plurality of cavities 1421 and cover a part of the upper surface 1201 of the second conductivity type semiconductor layer 120. The first planarization layer 13 can be formed by spin coating method such as spin-on glass (SOG). In one embodiment of this application, the spin-on-glass material can be a dielectric material comprising a mixture of $SiO_2$ and dopants (either boron or phosphorous) and suspended in a solution. The SOG material can also be polymers such as benzocyclobutene (BCB), HSQ (Hydrogen silesquioxane) or MSQ (Methylsequioxane).

Figure 1C:
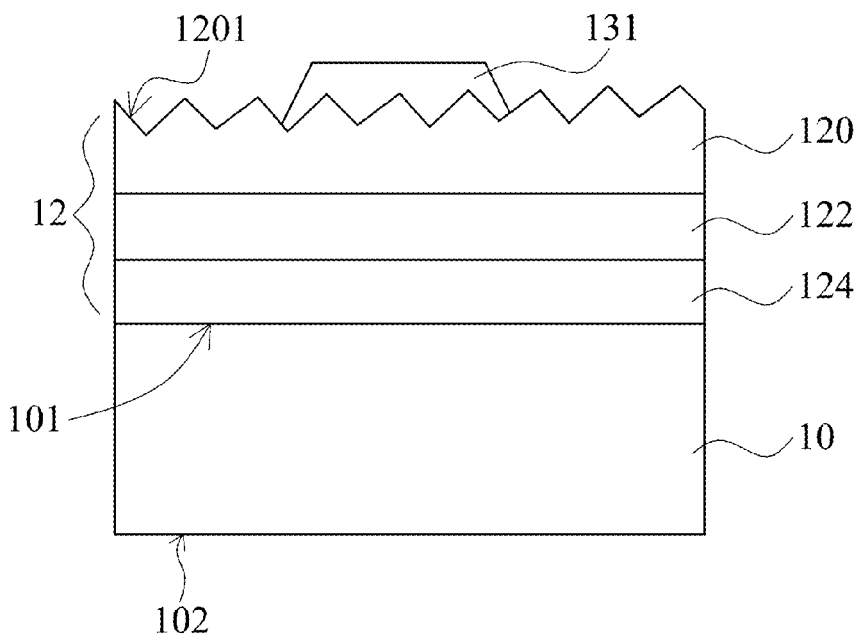

Referring to FIG. 1C, the first planarization layer 13 is patterned and solidified to form a second planarization layer 131 by etching or lithography method, wherein a part of the upper surface 1201 of the second conductivity type semiconductor layer 120 is exposed and not covered by the second planarization layer 131. The position of the second planarization layer 131 is not specified and can be formed in the middle or the peripheral area of the upper surface 1201 of the second conductivity type semiconductor layer 120.

Figure 1D:
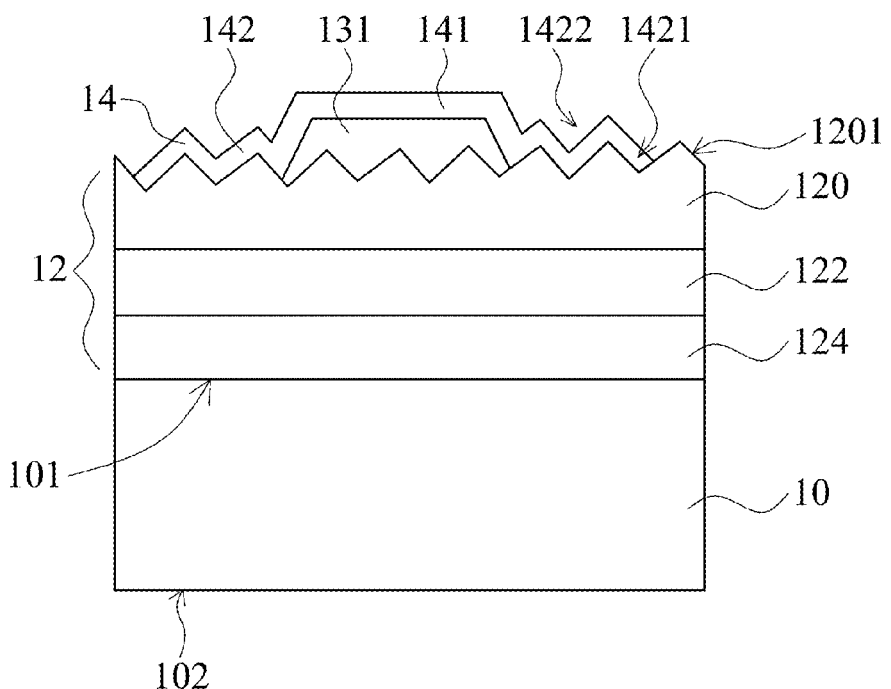

Referring to FIG. 1D, a first transparent conductive oxide layer 14 is formed to cover the entire second planarization layer 131 and to fill a part of the first plurality of cavities 1421 of the second conductivity type semiconductor layer 120, and therefore the first transparent conductive oxide layer 14 is in contact with a part of the upper surface 1201 of the second conductivity type semiconductor layer 120. The first transparent conductive oxide layer 14 includes a first portion 141 and a second portion 142, wherein the first portion 141 is in contact with the entire second planarization layer 131, which is substantially flat, and the second portion 142 is formed on the upper surface 1201 of the second conductivity type semiconductor layer and filled a part of the first plurality of cavities 1421. The second portion 142 comprises a second plurality of cavities 1422 vertically aligned with the first plurality of cavities 1421, and therefore the exposed upper surface of the second portion 142 opposite to the first plurality of cavities 1421 is a textured surface. The first plurality of cavities 1421 are formed in the upper portion of the second conductivity type semiconductor layer 120 and are shaped into cones or pyramids (as the shapes shown in FIGS. 1G-1H) by epitaxy method, etching method, or the combination thereof. The second plurality of cavities 1422 are shaped into a cone or a pyramid by etching process and the second plurality of cavities 1422 extends in a direction toward the first plurality of cavities 1421 of the second conductivity type semiconductor layer 120, wherein the direction of the extension is preferably perpendicular to the first surface 101 of the conductive substrate 10.

Figure 1E:
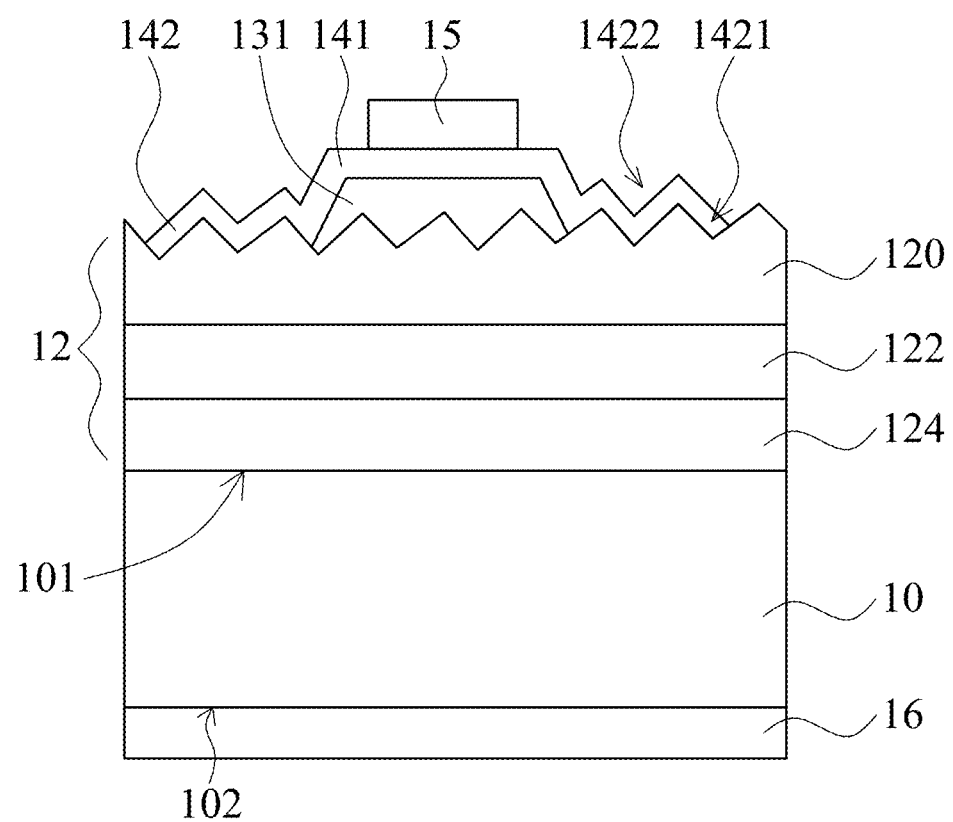

Referring to FIG. 1E, a first electrode 15 is formed on the first portion 141 of the first transparent conductive oxide layer 14; and a second electrode 16 is formed on the second surface 102 of the conductive substrate 10. The material of the electrode structure mentioned above can be metal material such as Cr, Ti, Ni, Pt, Cu, Au, Al, or Ag.

Figure 1F:
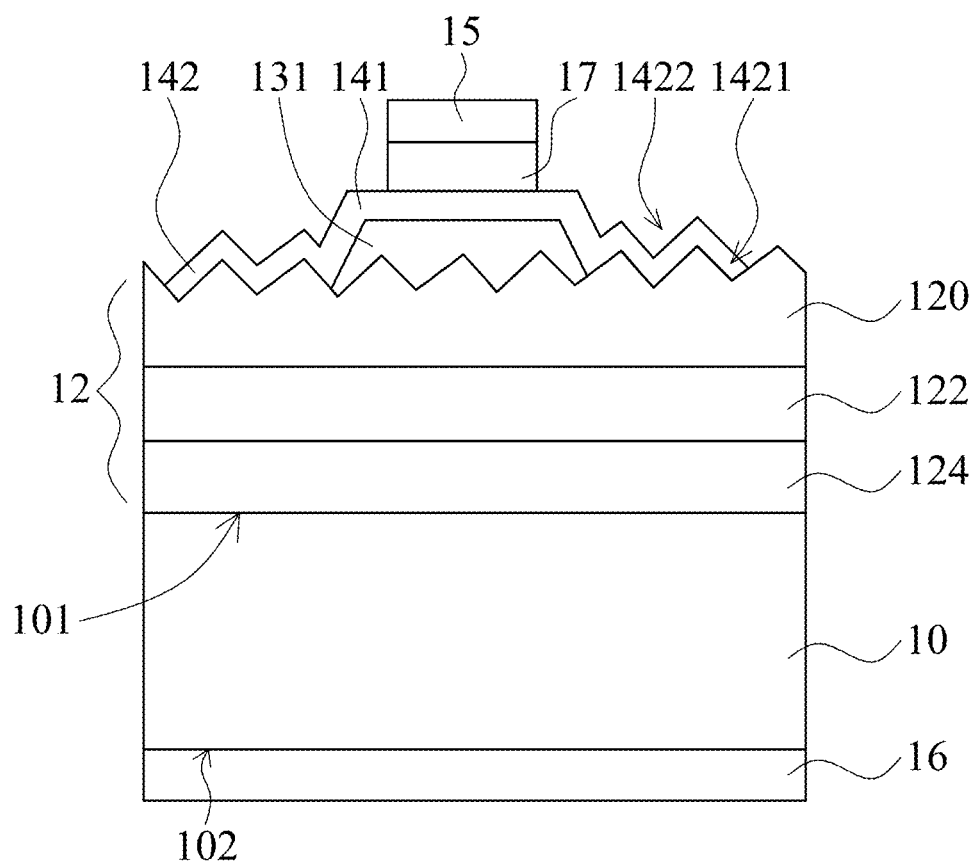
Figure 1G:
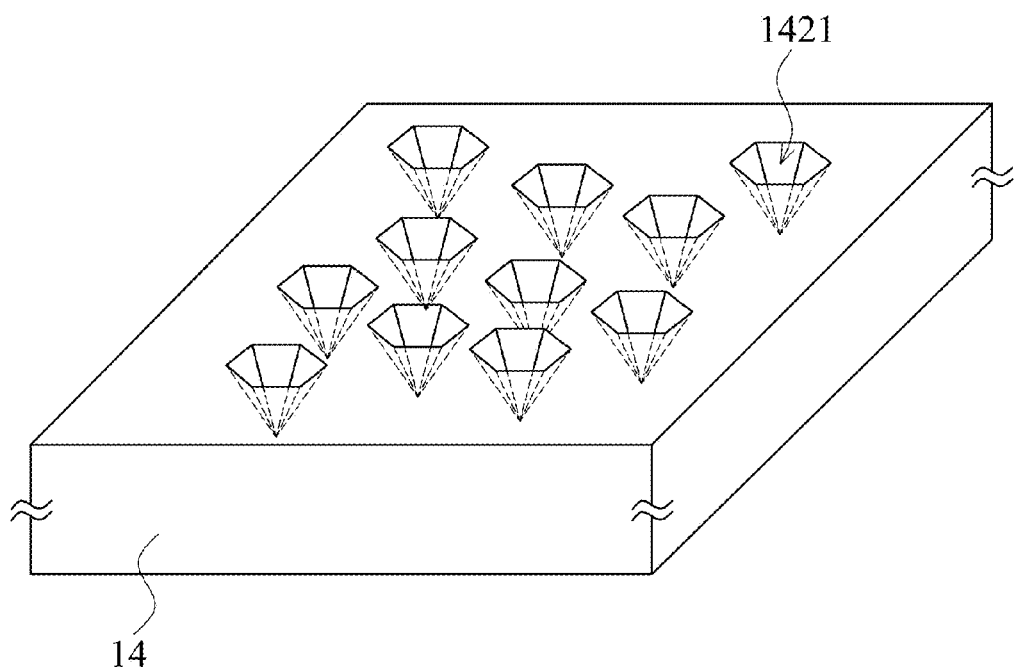
FIG. 1G is a top view of a second semiconductor layer in accordance with a first embodiment of the present application.
Figure 1H:
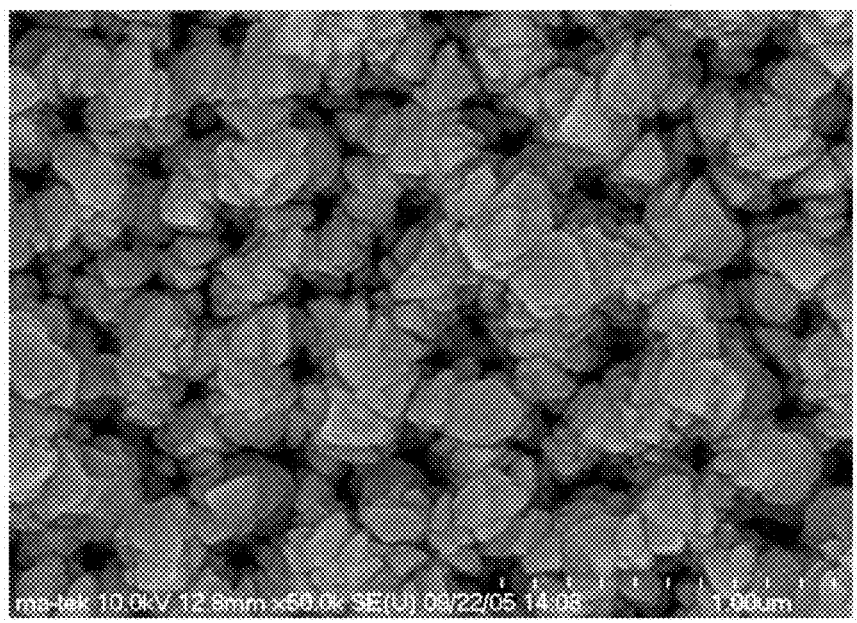
FIG. 1H is an SEM diagram showing a surface morphology of an ITO layer in accordance with a first embodiment of the present application.

Referring to FIG. 1F, in another embodiment of this application, a first reflective metal layer 17 can be formed between the first portion 141 of the first transparent conductive oxide layer 14 and the first electrode 15 to improve the light-emitting efficiency.

In accordance with the first embodiment of the present application, by forming the second planarization layer 131, a part of the transparent conductive oxide layer 14, the first electrode 15 and the first reflective metal layer 17 can be formed on a substantially flat surface, and the impedance and the forward voltage can be decreased, and the lateral current conduction, current spreading and efficiency can be increased.

Besides, because the second conductivity type semiconductor layer 120 comprises the first plurality of cavities 1421, the second portion 142 of the first transparent conductive oxide layer 14 is conformally formed on the second semiconductor layer 120. Thus, the second portion 142 of the first transparent conductive oxide layer 14 has the second plurality of cavities 1422. The adhesion strength between the second planarization layer 131 and the second conductivity type semiconductor layer 120 has been improved by the first plurality of cavities 1421.

Figure 2A:
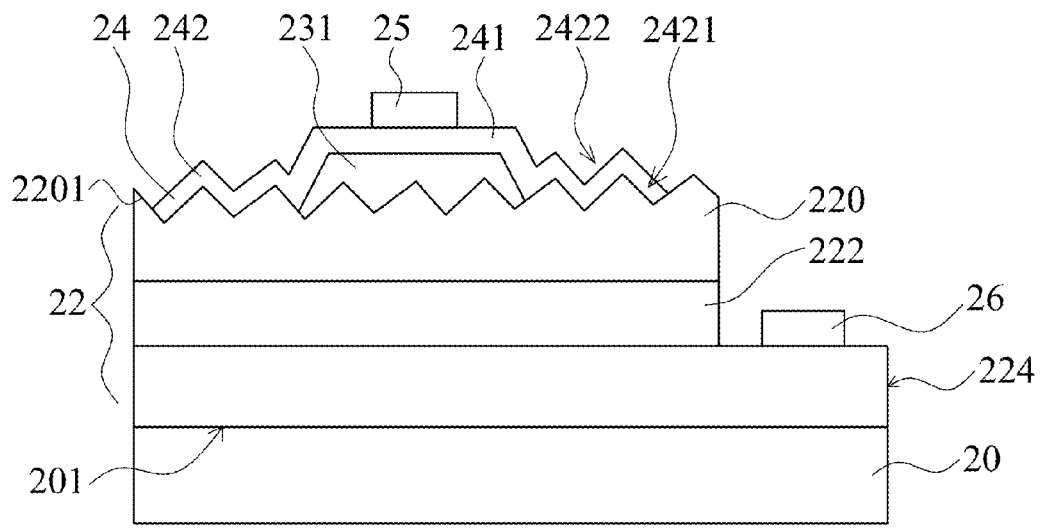
FIGS. 2A-2D are cross-sectional views of a light-emitting device in accordance with a horizontal type embodiment of the present application.

FIGS. 2A-2D are cross-sectional views of a light-emitting device in accordance with a horizontal type embodiment of the present application. Referring to FIG. 2A, a light-emitting device comprises a substrate 20; a light emitting stack 22 including a first conductivity type semiconductor layer 224, a light-emitting layer 222 and a second conductivity type semiconductor layer 220 sequentially formed on the first surface 201 of the substrate 20. The second conductivity type semiconductor layer 220 comprises a first plurality of cavities 2421 formed by an epitaxy method, an etching method, or the combination thereof, and thus the exposed upper surface 2201 of the second conductivity type semiconductor layer 220 is a textured surface The light emitting stack 22 is etched, and a part of the first conductivity type semiconductor layer 224 is exposed to form a horizontal type light emitting device.

The material of the light emitting stack 22 contains one or more elements selected from the group consisting of Ga, Al, In, As, P, N and Si, such as aluminum gallium indium phosphide (AlGaInP) series material, aluminum gallium indium nitride (AlGaInN) series material and so on. The light-emitting layer 222 can be a single heterostructure (SH), a double heterostructure (DH), a double-side double heterostructure (DDH), or a multi-quantum well (MWQ). Besides, the wavelength of the emitted light can also be adjusted by changing the number of the pairs of the quantum well.

The subsequent process for fabricating the light emitting device in accordance with the present embodiment is similar to the process for fabricating a light emitting device in accordance with the first embodiment as mentioned above. A first planarization layer (not shown) is formed by spin coating method such as spin-on glass (SOG) or to fill a part of the first plurality of cavities 2421 and to cover a part of the upper surface 2201 of the second conductivity type semiconductor layer 220. The first planarization layer can be formed by spin coating method such as spin-on glass (SOG). In one embodiment of this application, the SOG material can be a dielectric material comprising a mixture of $SiO_2$ and dopants (either boron or phosphorous) and suspended in a solution. The SOG can also be polymers such as HSQ (Hydrogen silesquioxane), benzocyclobutene (BCB) or MSQ (Methylsequioxane).

Then, the first planarization layer (not shown) is patterned and solidified to form a second planarization layer 231 by etching or lithography method, wherein a part of the upper surface 2201 of the second conductivity type semiconductor layer 220 is exposed and not covered by the second planarization layer 231. The position of the second planarization layer 231 is not specified and can be formed in the middle or the peripheral area of the upper surface 2201 of the second conductivity type semiconductor layer 220.

Following, a first transparent conductive oxide layer 24 is formed to cover the entire second planarization layer 231 and to fill a part of the first plurality of cavities 2421 of the second conductivity type semiconductor layer 220, and therefore the first transparent conductive oxide layer 24 is in contact with a part of the upper surface 2201 of the second conductivity type semiconductor layer 220. The first transparent conductive oxide layer 24 includes a first portion 241 and a second portion 242, wherein the first portion 241 is in contact with the entire second planarization layer 231, which is substantially flat, and the second portion 242 is formed on the upper surface 2201 of the second conductivity type semiconductor layer 220 and filled a part of the first plurality of cavities 2421. The second portion 242 comprises a second plurality of cavities 2422 vertically aligned with the first plurality of cavities 2421, and therefore the exposed upper surface of the second portion 242 opposite to the first plurality of cavities 1421 is a textured surface. The first plurality of cavities 2421 are formed in the upper portion of the second conductivity type semiconductor layer 220 and are shaped into cones or pyramids and formed by an epitaxy method, an etching method, or the combination thereof. The second plurality of cavities 2422 are shaped into a cone or a pyramid by an etching process and the second plurality of cavities 2422 extends in a direction toward the first plurality of cavities 2421 of the first transparent conductive layer 24, wherein the direction of the extension is preferably perpendicular to the first surface 201 of the substrate 20.

Finally, a first electrode 25 is formed on the first portion 241 of the first transparent conductive oxide layer 24; and a second electrode 26 is formed on the exposed first conductivity type semiconductor layer 224. The material of the electrode structure mentioned above can be metal material such as Cr, Ti, Ni, Pt, Cu, Au, Al, Ag, or the alloy thereof. By the combination of the flat first portion and the textured second portion of the transparent conductive oxide layer, the lower efficiency is alleviated, the impedance and the forward voltage can be decreased, and the lateral current conduction, current spreading and efficiency can be increased.

Figure 2B:
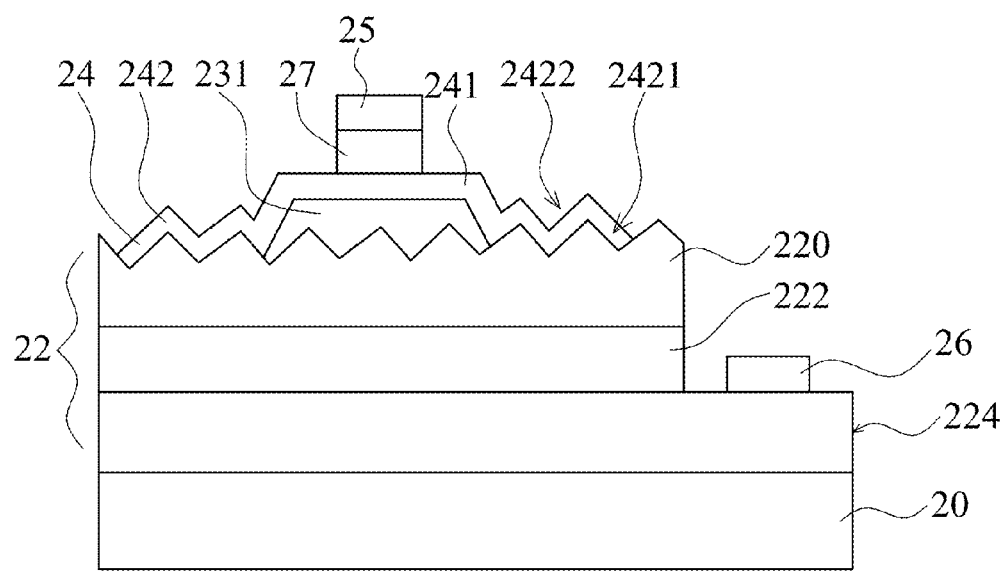

Referring to FIG. 2B, In another embodiment of this application, a first reflective metal layer 27 can be formed between the first portion 241 of the first transparent conductive oxide layer 24 and the first electrode 25 to improve the light-emitting efficiency. Because the second conductivity type semiconductor layer 220 comprises the first plurality of cavities 2421, the second portion 242 of the first transparent conductive oxide layer 24 is conformally formed on the second semiconductor layer 220. Thus, the second portion 242 of the first transparent conductive oxide layer 24 has the second plurality of cavities 2422. The adhesion strength between the second planarization layer 231 and the second conductivity type semiconductor layer 220 has been improved by the first plurality of cavities 2421. By the combination of the flat first portion and the textured second portion of the, the lower efficiency is alleviated, the impedance and the forward voltage can be decreased, and the lateral current conduction, current spreading and efficiency can be increased.

Figure 2C:
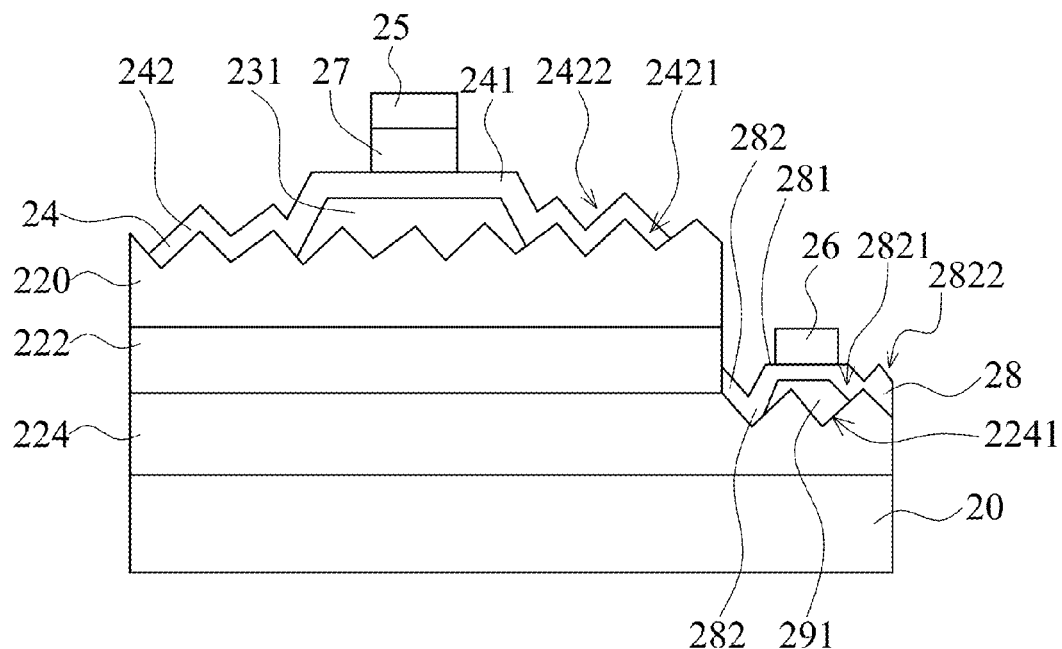

Referring to FIG. 2C, in another embodiment of this application, the difference between the FIG. 2A and FIG. 2C is that the first conductivity type semiconductor layer 224 is etched to form a textured surface 2241, and thus the first conductivity type semiconductor layer 224 comprises a third plurality of cavities 2821. The subsequent process for fabricating the light emitting device in accordance with the present embodiment is similar to the process for fabricating a light emitting device in accordance with the embodiment in FIG. 2A. A third planarization layer (not shown) is formed by spin coating method such as spin-on glass (SOG) to fill a part of the third plurality of cavities 2821 and to cover a part of the upper surface 2241 of the first conductivity type semiconductor layer 220, and then the third planarization layer (not shown) is patterned and solidified to form a fourth planarization layer 291 by etching or lithography method, wherein a part of the upper surface 2241 of the first conductivity type semiconductor layer 224 is exposed. The position of the fourth planarization layer 291 is not specified and can be formed in the middle or the peripheral area of the second conductivity type semiconductor layer 224.

Following, a second transparent conductive oxide layer 28 is formed to cover the entire fourth planarization layer 291 and to fill a part of the third plurality of cavities 2821 of the first conductivity type semiconductor layer 224. Therefore, the second transparent conductive oxide layer 28 is in contact with a part of the upper surface 2241 of the first conductivity type semiconductor layer 224. The second transparent conductive oxide layer 28 includes a first portion 281 and a second portion 282, wherein the first portion 281 is in contact with the entire fourth planarization layer 291, which is substantially flat, and the second portion 282 is formed on the upper surface 2241 of the first conductivity type semiconductor layer 224 and filled a part of the third plurality of cavities 2821. The second portion 282 comprises a fourth plurality of cavities 2822 vertically aligned with the third plurality of cavities 2821 and therefore the exposed upper surface of the second portion 282 opposite to the third plurality of cavities 2821 is a textured surface. The third plurality of cavities 2821 is formed in the upper portion of the first conductivity type semiconductor layer 224 and are shaped into cones or pyramids and formed by epitaxy method, etching method, or the combination thereof. The fourth plurality of cavities 2822 are shaped into a cone or a pyramid by etching process and the fourth plurality of cavities 2822 extends in a direction toward the third plurality of cavities 2821 of the second transparent conductive layer 28, wherein the direction of the extension is preferably perpendicular to the first surface 201 of the substrate 20.

Finally, a first electrode 25 is formed on the first portion 241 of the first transparent conductive oxide layer 24; and a second electrode 26 is formed on the first portion 281 of the second transparent conductive oxide layer 28. The material of the electrode structure mentioned above can be metal material such as Cr, Ti, Ni, Pt, Cu, Au, Al, or Ag. By the combination of the flat first portion and the textured second portion of the first transparent conductive oxide layer and by the combination of the flat first portion and the textured second portion of the second transparent conductive oxide layer, the lower efficiency issue is alleviated, the impedance and the forward voltage can be decreased, and the lateral current conduction, current spreading and efficiency can be increased.

Figure 2D:
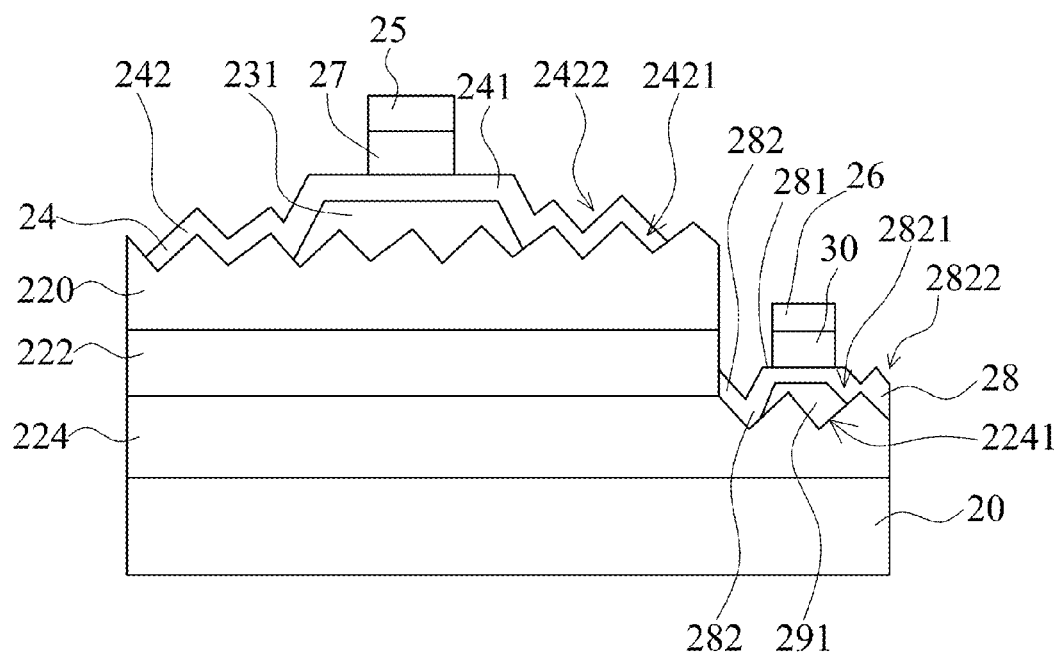

Referring to FIG. 2D, in another embodiment of this application, a second reflective metal layer 30 can be formed between the first portion 281 of the second transparent conductive oxide layer 28 and the second electrode 26. The first reflective metal layer 27 can be formed between the first portion 241 of the first transparent conductive oxide layer 24 and the first electrode 25. As a result, the light-emitting efficiency is improved.

Figure 3:
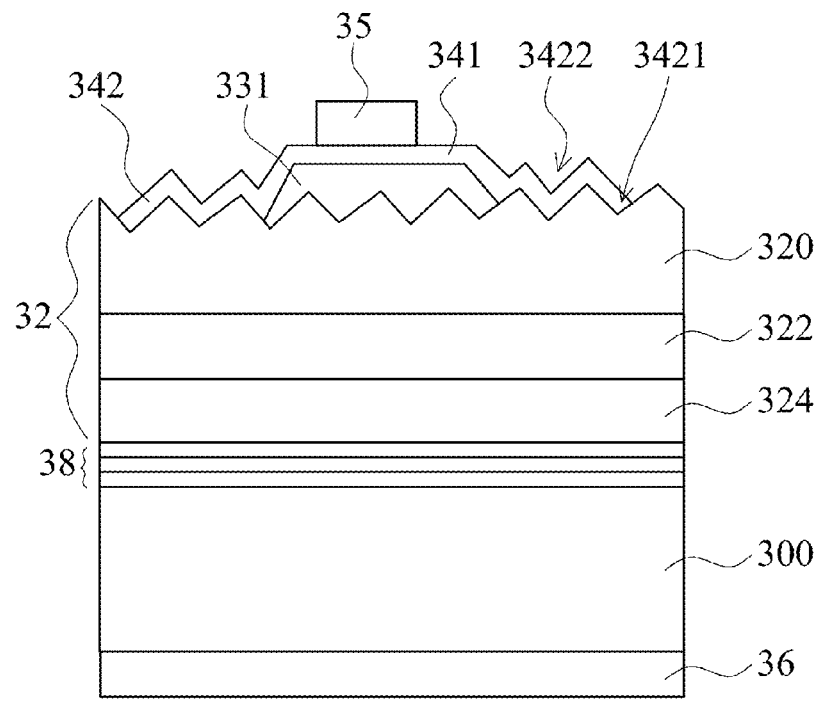
FIG. 3 is a cross-sectional view of a light-emitting device in accordance with a third embodiment of the present application.

FIG. 3 is a cross-sectional view of a light-emitting device in accordance with a third embodiment of the present application. The difference between the third embodiment and the first embodiment is that an additional Distributed Bragg Reflector (DBR) layer 38 is formed between the conductive substrate 36 and the first conductivity type semiconductor layer 324.

Figure 4:
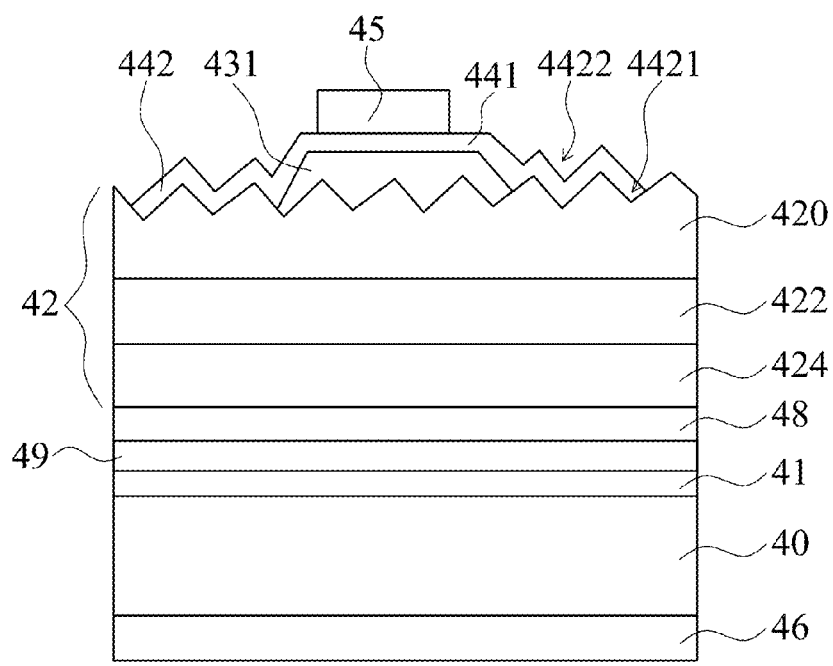
FIG. 4 is a cross-sectional view of a light-emitting device in accordance with a fourth embodiment of the present application.

FIG. 4 is a cross-sectional view of a light-emitting device in accordance with a fourth embodiment of the application. The difference between the fourth embodiment and the first embodiment is that a metal bonding layer 41, a reflective layer 49 and a second transparent conductive oxide layer 48 are formed between the conductive substrate 46 and the first conductivity type semiconductor layer 424.

Figure 5:
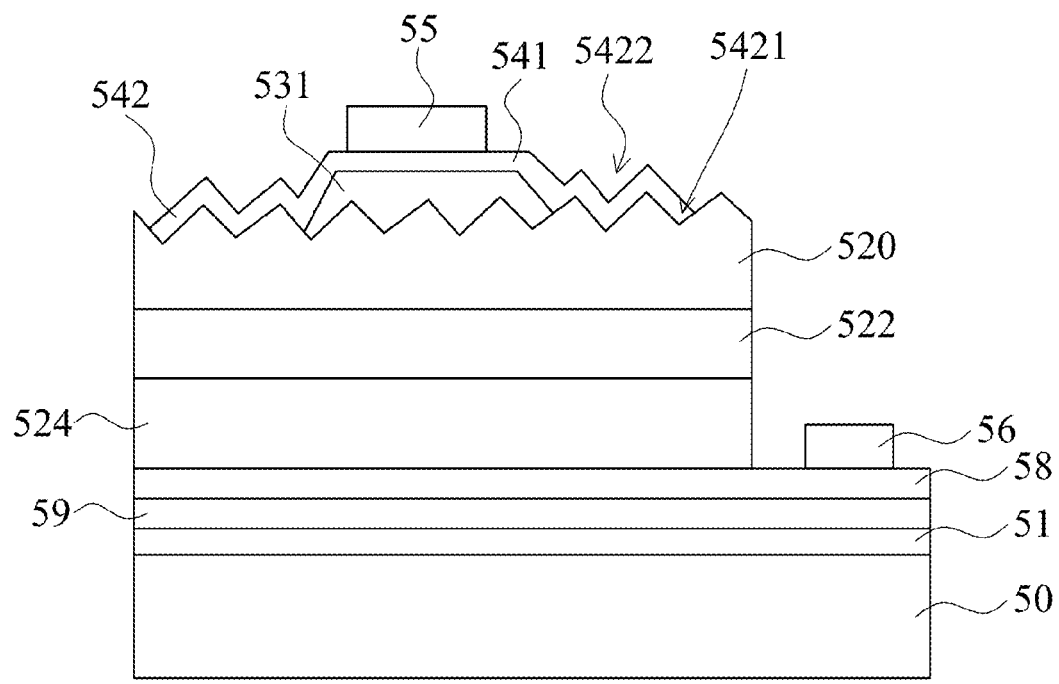
FIG. 5 is a cross-sectional view of a light-emitting device in accordance with a fifth embodiment of the present application.

FIG. 5 is a cross-sectional view of a light-emitting device in accordance with a fifth embodiment of the present application. The difference between the fourth embodiment and the second embodiment is that a metal bonding layer 51, a reflective layer 59 and a second transparent conductive oxide layer 58 are formed between the substrate 50 and the first conductivity type semiconductor layer 524. The second electrode 56 is formed on the second transparent conductive oxide layer 58.

Figure 6A:
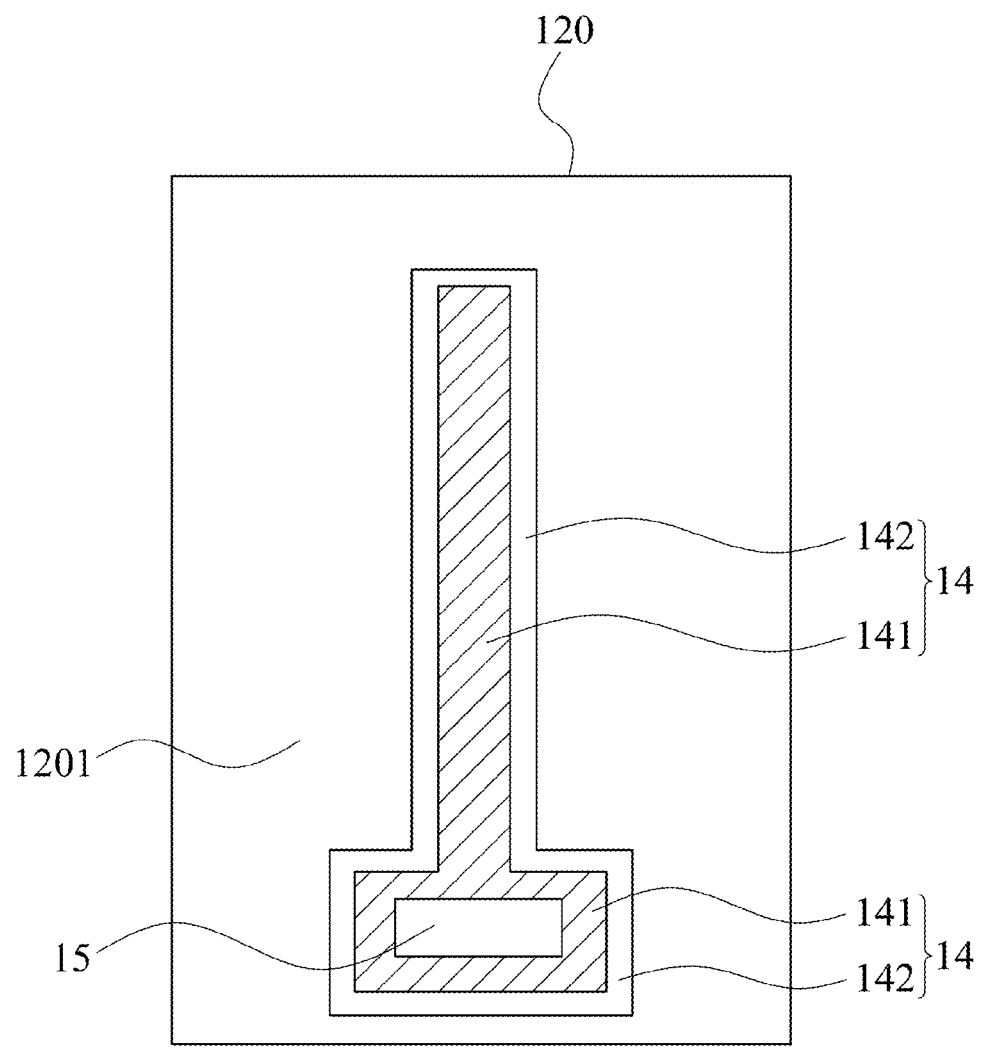
FIGS. 6A-6B are top views of a second semiconductor layer in accordance with a first embodiment of the present application.
Figure 6B:
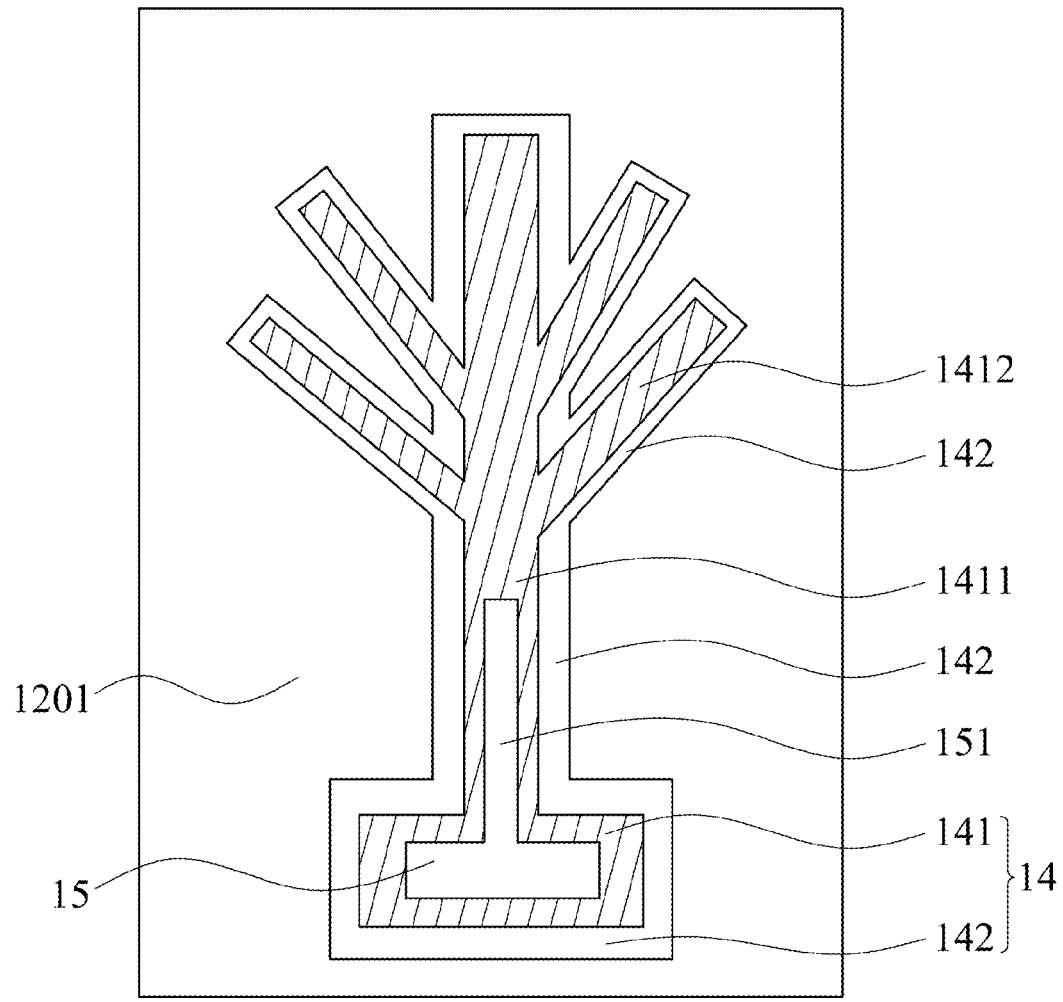

FIGS. 6A-6B are top views of a second semiconductor layer in accordance with a first embodiment of the present application. FIG. 6A is a top view of a second semiconductor layer 120, the second planarization layer (not shown) can be formed on part of the second semiconductor layer 120. After forming the second planarization layer, the first transparent conductive oxide layer 14 is formed on part of the second planarization layer and has a first portion 141 in contact with the entire second planarization layer, which is substantially flat. The first transparent conductive oxide layer 14 further has a second portion 142 formed on the second semiconductor layer 120 with a textured surface. Following, a first electrode 15 is formed on the first portion 141 of the first transparent conductive oxide layer 14. In this embodiment, a part of the first transparent conductive oxide layer 14 is not covered by the first electrode 15 and extends as a finger toward the other end of the light emitting chip to spread the current.

Referring to FIG. 6B, in another embodiment, the first electrode 15 can have a first branch 151 having a finger-like pattern and extends toward the other end of the light emitting device to have better current spreading. The first transparent conductive oxide layer 14 can further have a secondary branch 1411 having a finger-like pattern and extends toward the other end of the light emitting device. The first transparent conductive oxide layer 14 can further have a third class branch 1412 as a transparent finger extending from the secondary branch 1411 to increase the current spreading. In this embodiment, a part of the secondary branch 1411 and the third class branch 1412 of the first transparent conductive oxide layer 14 is not covered by the first branch 151 of the first electrode 15. Since the secondary branch 1411 of the first transparent conductive oxide layer 14 and the third class branch 1412 of the first transparent conductive oxide layer 14 are formed on the second planarization layer (not shown), the secondary branch 1411 and the third class branch 1412 are also substantially flat and can have better current spreading efficiency.

Figure 7A:
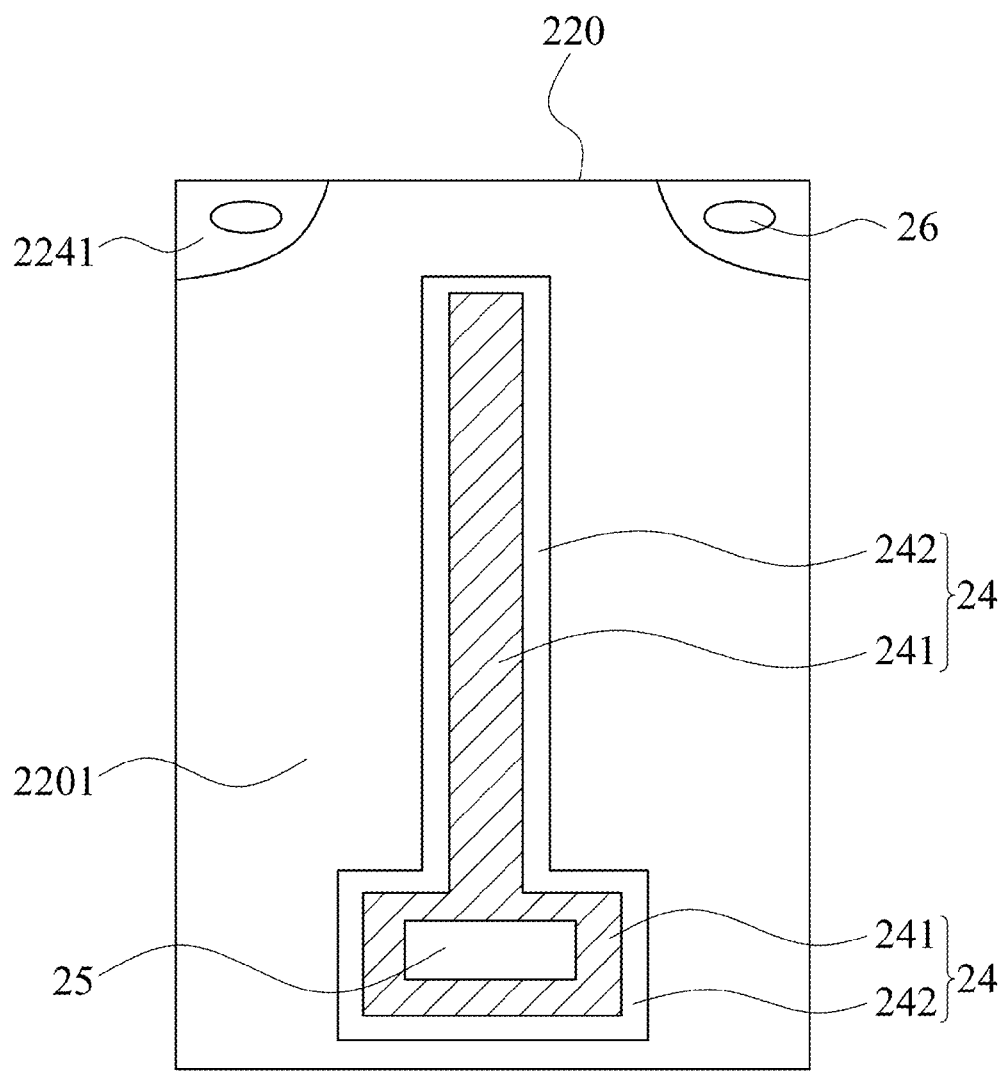
FIGS. 7A-7B are top views second semiconductor layer in accordance with a second embodiment of the present application.
Figure 7B:
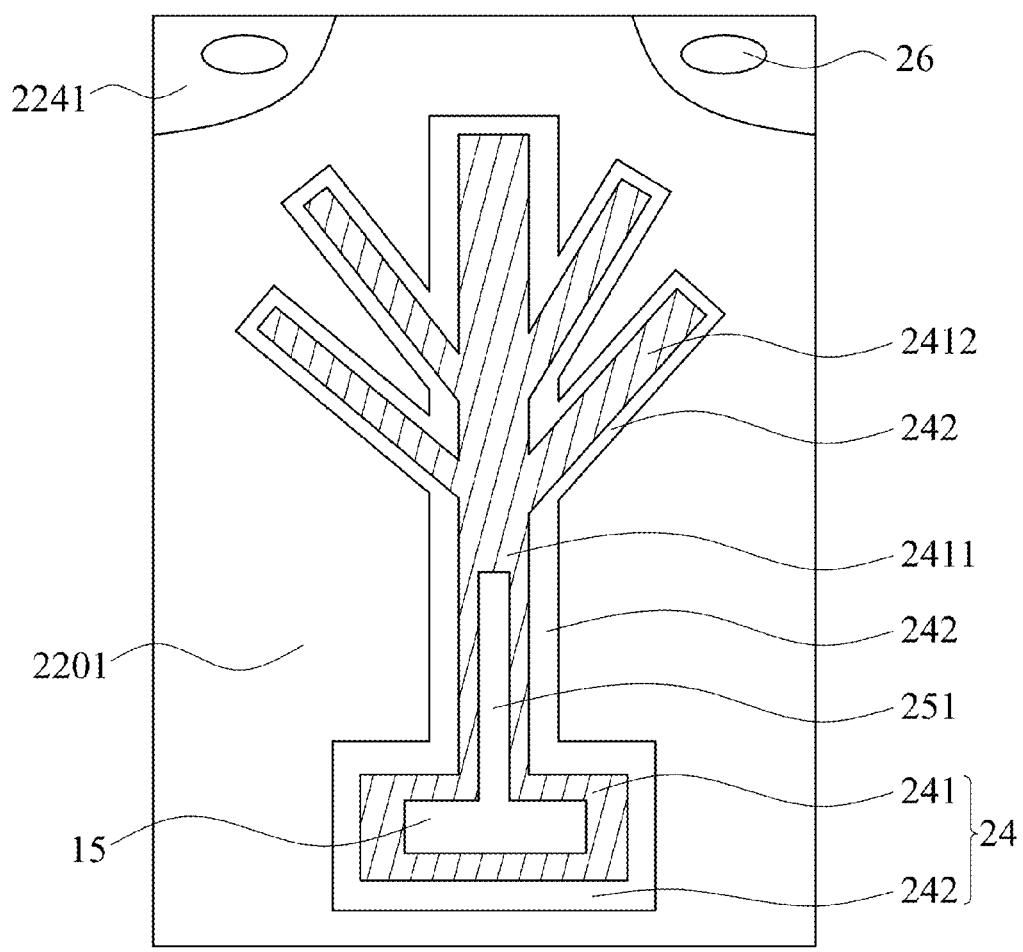

FIGS. 7A-7B are top views of a second semiconductor layer in accordance with a second embodiment of the present application. FIG. 7A is a top view of a second semiconductor layer 220, the second planarization layer (not shown) can be formed on a part of the second semiconductor layer 220. After forming the second planarization layer, the first transparent conductive oxide layer 24 is formed on a part of the second planarization layer and has a first portion 241 in contact with the entire second planarization layer, which is substantially flat. The first transparent conductive oxide layer 24 further has a second portion 242 formed on the second semiconductor layer 220 with a textured surface. Following, a first electrode 25 is formed on the first portion 241 of the first transparent conductive oxide layer 24. In this embodiment, a part of the first transparent conductive oxide layer 24 is not covered by the first electrode 25 and extends as a finger toward the other end of the light emitting chip to spread the current.

Referring to FIG. 7B, in another embodiment, the first electrode 25 can have a first branch 251 having a finger-like pattern and extends toward the other end of the light emitting device to have better current spreading. The first transparent conductive oxide layer 24 can further have a secondary branch 2411 having a finger-like pattern and extending toward the other end of the light emitting device. The first transparent conductive oxide layer 24 can further have third class branch 2412 as a transparent finger extending from the secondary branch 2411 to increase the current spreading. In this embodiment, a part of the secondary branch 2411 and the third class branch 2412 of the first transparent conductive oxide layer 24 are not covered by the first branch 251 of the first electrode 25. Since the secondary branch 2411 of the first transparent conductive oxide layer 24 and the third class branch 2412 of the first transparent conductive oxide layer 24 are formed on the second planarization layer (not shown), the secondary branch 2411 and the third class branch 2412 are also substantially flat and can have better current spreading efficiency.

Figure 8A:
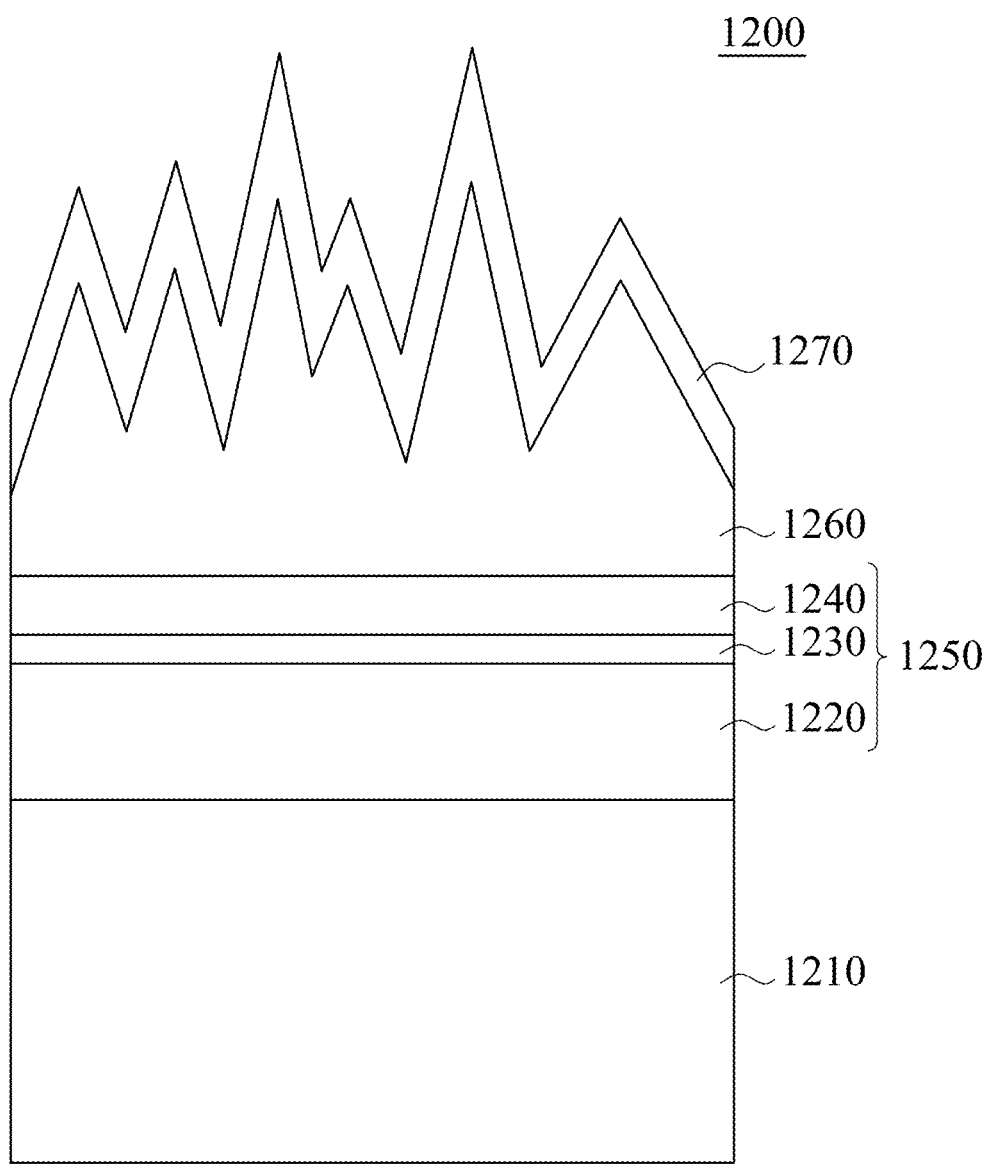
FIGS. 8A-8C are cross-sectional views of a light emitting device in accordance with a third embodiment of the present application.
Figure 8B:
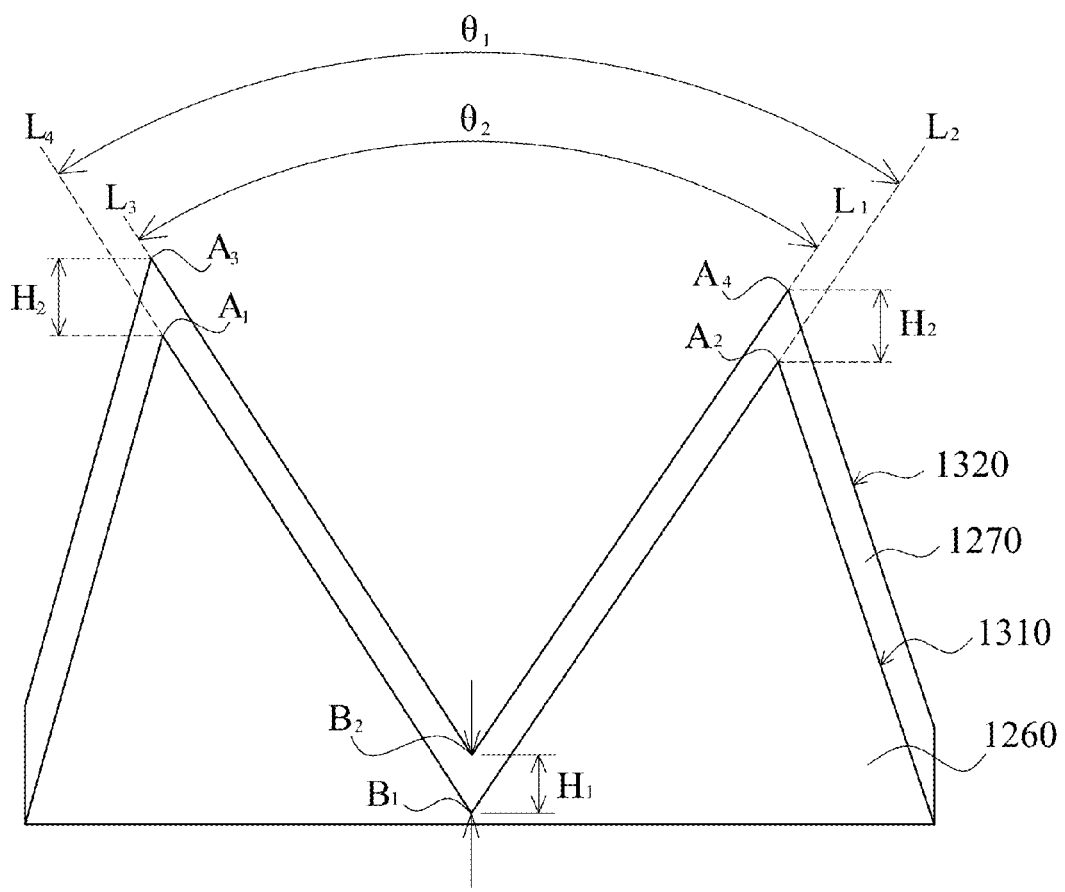
Figure 8C:
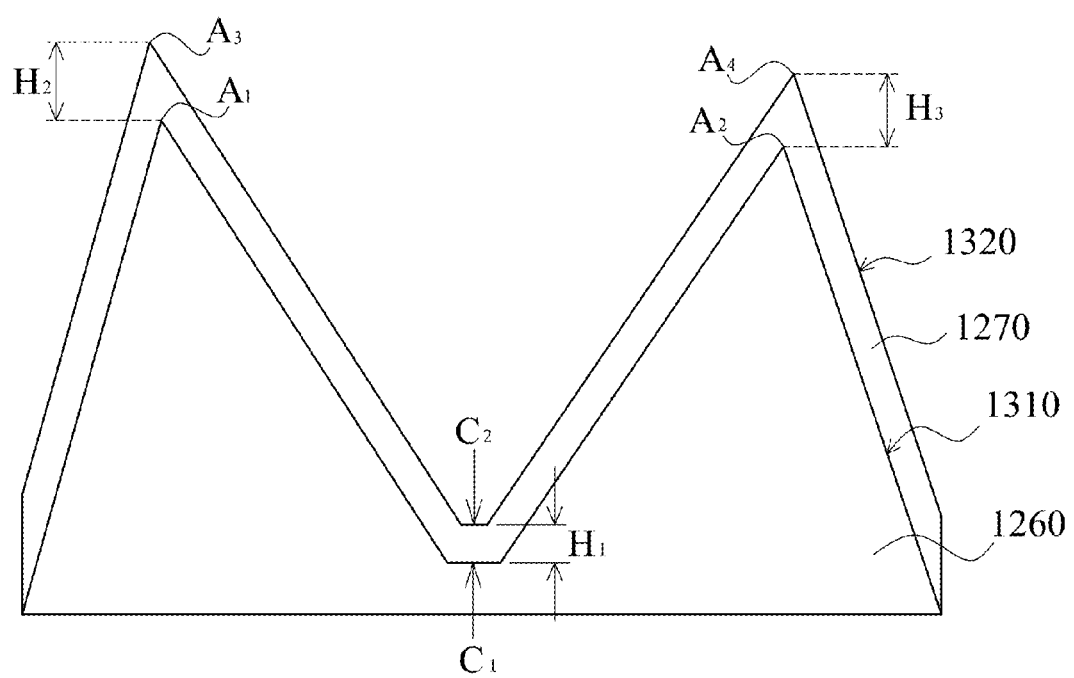

FIGS. 8A-8C are cross-sectional views of a light emitting device 1200 in accordance with a third embodiment of the present application. FIG. 8A illustrates a substrate 1210, a light-emitting structure 1250 formed on the substrate 1210, a semiconductor contact layer 1260 formed on the light-emitting structure 1250 and having a rough top surface, and a transparent current spreading layer 1270 formed on the semiconductor contact layer 1260 and having a top surface. The light-emitting structure 1250 includes a first conductivity type semiconductor layer 1220, an active layer 1230, and a second conductivity type semiconductor layer 1240. The rough top surface of the semiconductor contact layer 1260 is substantially right under the top surface of the transparent current spreading layer 1270. The substrate 1210 is a growth base or a carrier base. The material of the semiconductor contact layer 1260 and the light-emitting structure 1250 comprise one or more elements selected from a group consisting of gallium, aluminum, indium, arsenic, phosphorous, nitrogen, and silicon. The transparent current spreading layer 1270 comprises a metal oxide or a metal nitride.

Following, FIG. 8B illustrates an enlarged diagram of a partial region of the semiconductor contact layer 1260 and of the transparent current spreading layer 1270. The rough top surface 1310 of the semiconductor contact layer 1260 comprises any two adjacent first crests having a first highest point $A_1$, $A_2$ respectively and comprises a first trough having a first lowest point $B_1$ between the two adjacent first crests. The top surface 1320 of the transparent current spreading layer 1270 comprises any two adjacent second crests having a second highest point $A_3$, $A_4$ respectively and comprises a second trough having a second lowest point $B_2$ between the two adjacent second crests. Two oblique lines $L_2$, $L_4$ are formed by connecting the highest points $A_1$ and the lowest point $B_1$ of the rough top surface 1310 of the semiconductor contact layer 1260 and formed by connecting the highest points $A_2$ and the lowest point $B_1$. A first angle $\Theta_1$ is formed between the two oblique lines $L_2$, $L_4$. Two oblique lines $L_1$, $L_3$ are formed by connecting the highest points $A_3$ and the lowest point $B_2$ of the top surface 1320 of the transparent current spreading layer 1270 and by connecting the highest points $A_4$ and the lowest point $B_2$. A second angle $\Theta_2$ is formed between the two oblique lines $L_1$, $L_3$. A difference between the first angle $\Theta_1$ and the second angle $\Theta_2$ is not greater than 10 degrees. In another embodiment, the first angle $\Theta_1$ is substantially the same as the second angle $\Theta_2$. A height difference $H_1$ between the second lowest point $B_2$ of the second trough of the top surface 1320 of the transparent current spreading layer 1270 and the first lowest point $B_1$ of the first trough of the rough top surface 1310 of the semiconductor contact layer 1260 is greater than 0. A height difference $H_2$ between the second highest point $A_3$ of the crest of the top surface 1320 of the transparent current spreading layer 1270 and the highest point $A_1$ of the crest of the rough top surface 1310 of the semiconductor contact layer 1260 is greater than 0. A height difference $H_3$ between the highest point $A_4$ of the crest of the top surface 1320 of the transparent current spreading layer 1270 and the highest point $A_2$ of the crest of the rough top surface 1310 of the semiconductor contact layer 1260 is greater than 0. The height difference $H_2$ is the same as or different from the height difference $H_3$. A ratio of the height difference $H_1$ to the height difference $H_2$ ranges from 0.1 to 10. A ratio of the height difference $H_1$ to the height difference $H_3$ ranges from 0.1 to 10. In another embodiment, the semiconductor contact layer 1260 comprises a cavity shaped as cone or pyramid, wherein the cavity extends in a direction toward the light-emitting structure 1250 so as to form the rough top surface 1310.

FIG. 8C illustrates another enlarged diagram of a partial region of the semiconductor contact layer 1260 and of the transparent current spreading layer 1270. The first trough of the rough top surface 1310 of the semiconductor contact layer 1260 comprises a flat region $C_1$. The trough of the top surface 1320 of the transparent current spreading layer 1270 comprises a flat region $C_2$. A height difference $H_1$ between the flat region $C_2$ of the trough of the top surface 1320 of the transparent current spreading layer 1270 and the flat region $C_1$ of the trough of the rough top surface 1310 of the semiconductor contact layer 1260 is greater than 0.

Figure 9A:
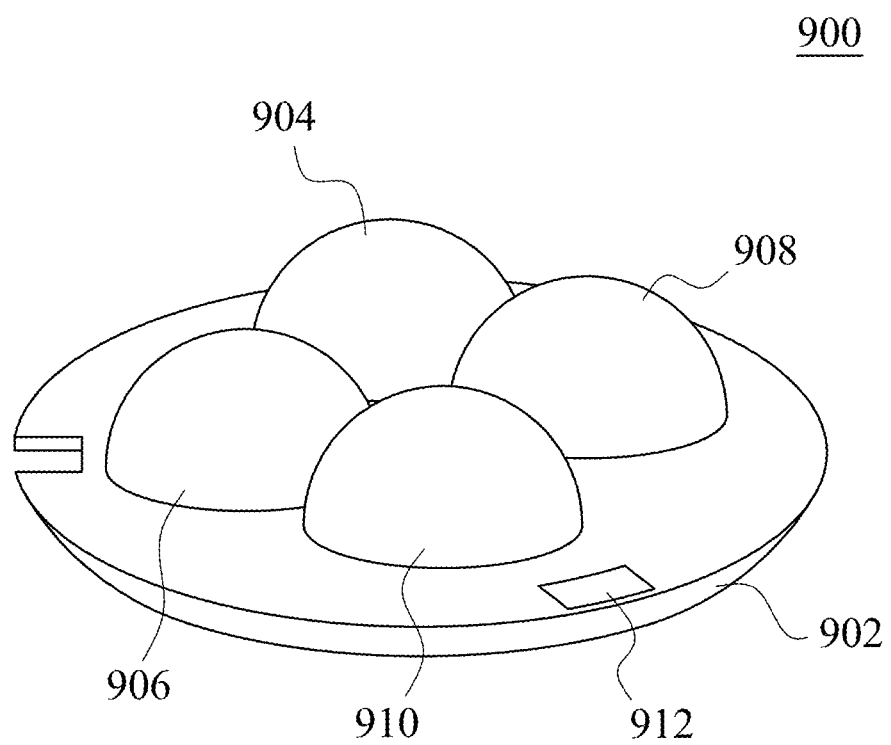
FIGS. 9A to 9C illustrates an LED module of an embodiment in the present disclosure.
Figure 9B:
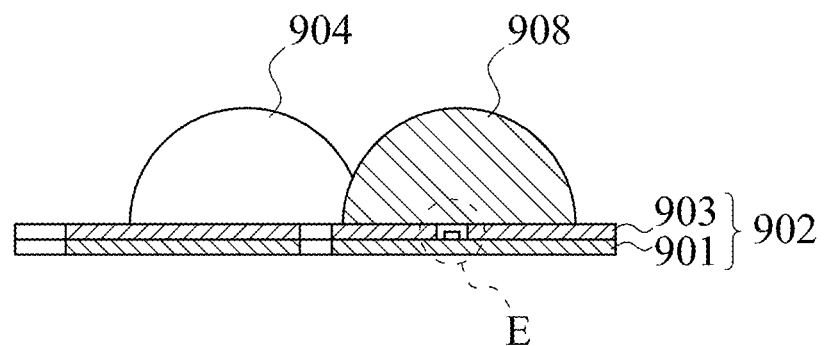
Figure 9C:
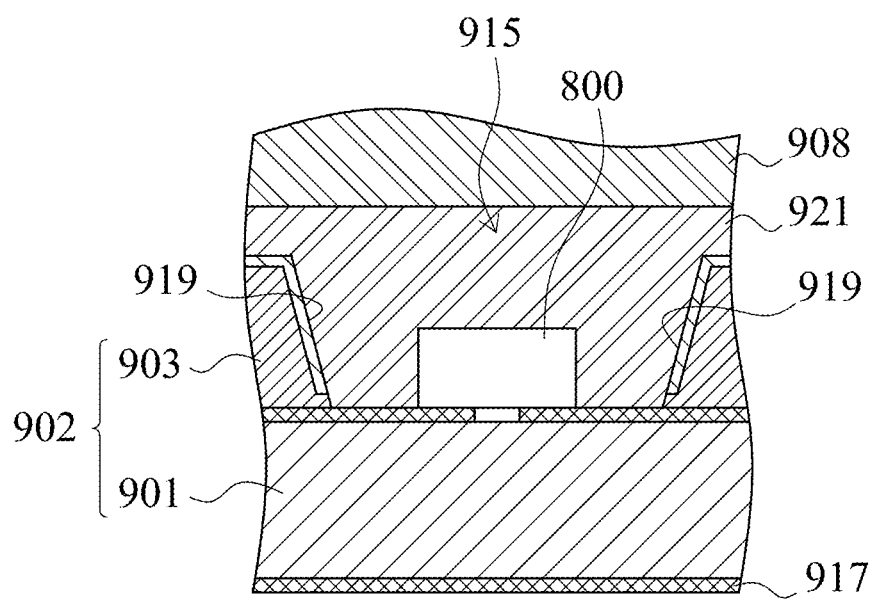

FIGS. 9A-9C illustrates an LED module of an application in the present disclosure. FIG. 9A is an external perspective view illustrating an optoelectronic device module 900 including a submount 902, an optoelectronic device (not illustrated) described above, a plurality of lens 904, 906, 908, 910, and two power supply terminals 912, The optoelectronic device module 900 is attached to a lighting unit 1000 (mentioned later).

FIG. 9B is a plan view illustrating the optoelectronic device module 900, and FIG. 9C is an enlarged view illustrating a portion E illustrated in FIG. 9B. As FIG. 9B illustrates, the submount 902 includes an upper subunit 903 and a lower subunit 901, and at least one surface of the lower subunit 901 in contact with the upper subunit 903. The lens 904, 908 are formed on the upper subunit 903. At least one through hole 915 is formed in the upper subunit 903 and at least one of the optoelectronic devices 800 is formed inside the through hole 915 and is in contact with the lower subunit 901. Besides, the optoelectronic device 800 is encapsulated by an encapsulating material 921, and a lens 908 is formed on the encapsulating material 921, wherein the material of the encapsulating material 921 may be a silicone resin, an epoxy resin or the like. In one embodiment, a reflecting layer 919 is formed on the sidewall surrounding the through hole 915 to increase the light emitting efficiency.

A metal layer 917 can be formed on the lower surface of the lower subunit 901 for improving heat dissipation.

Figure 10A:
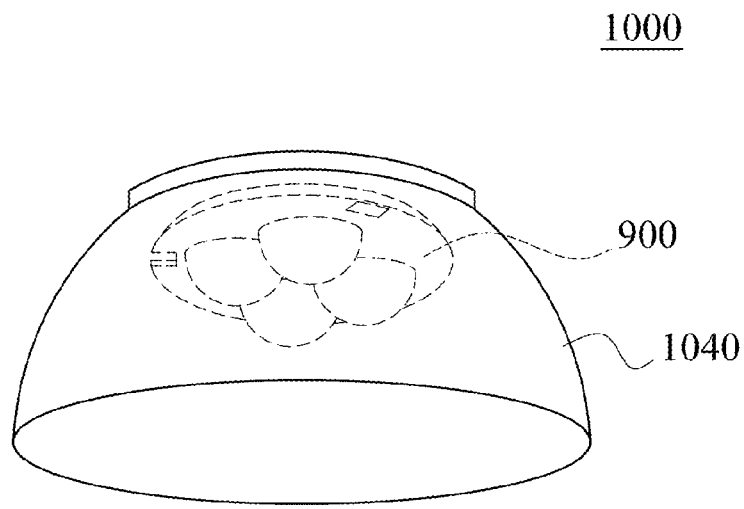
FIGS. 10A-10B illustrates a lighting apparatus of an embodiment in the present disclosure.
Figure 10B:
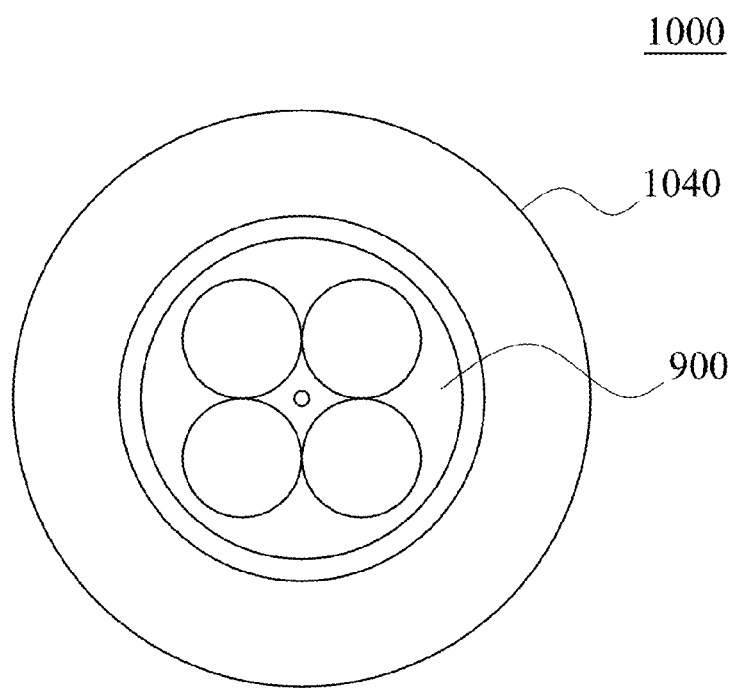

FIGS. 10A-10B illustrate a lighting apparatus of an embodiment in the present disclosure. The lighting apparatus 1000 includes an optoelectronic device module 900, a case 1040, a power supply circuit (not illustrated) to supply current to the optoelectronic device module 900, and the lighting apparatus 1000 further includes a control unit (not illustrated) to control the power supply circuit. The lighting apparatus 1000 can be an illumination device, such as street lamps, headlights or indoor illumination light source, and can be a traffic sign or a backlight module of the display panel.

Figure 11:
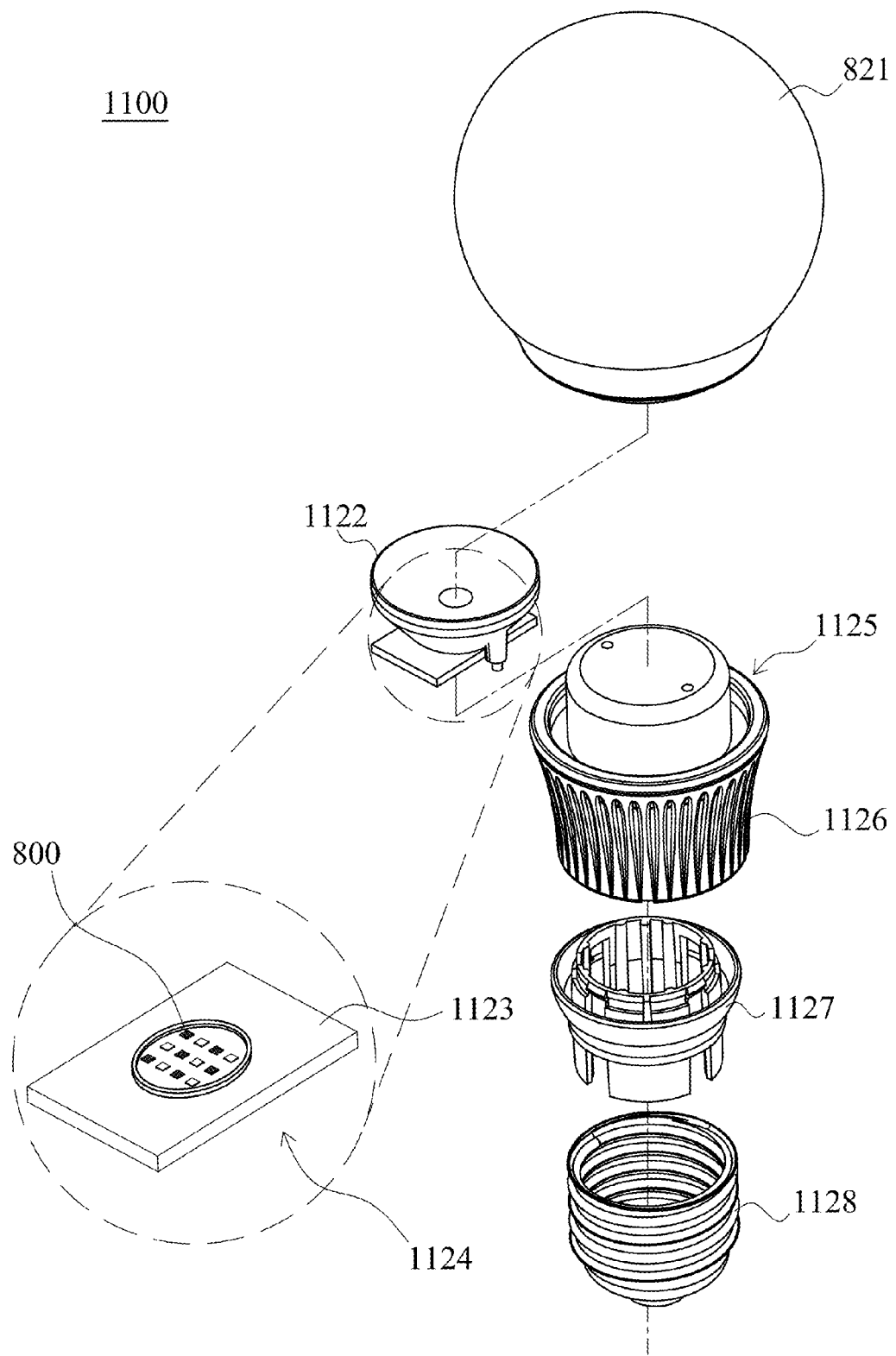
FIG. 11 is an explosive diagram of a bulb in accordance with an embodiment of the present application.

FIG. 11 illustrates an explosive diagram of a bulb in accordance with another application of the present application. The bulb 1100 comprises a cover 1121, a lens 1122, a lighting module 1124, a lamp holder 1125, a heat sink 1126, a connecting part 1127, and an electrical connector 1128. The lighting module 1124 comprises a carrier 1123 and a plurality of optoelectronic devices 800 of any one of the above mentioned embodiments on the carrier 1123.

Specifically, the optoelectronic device comprises light-emitting diodes (LED), photodiodes, photo resisters, laser diodes, infrared emitters, organic light-emitting diodes, and solar cells. The conductive substrate 10, 36, 46 and/or the substrate 20, 1210, 50, can be a growing or carrying base. The material of the substrate 20, 1210, 50, comprises an electrically conductive substrate, electrically insulating substrate, transparent substrate, or opaque substrate. The material of the electrically conductive substrate can be metal such as Ge and GaAs, oxide such as $LiAlO_2$ and ZnO, nitrogen compound such as GaN and AlN, phosphide such as InP, silicon compound such as SiC, or Si. The material of the transparent substrate can be chosen from sapphire ($Al_2O_3$), $LiAlO_2$, ZnO, GaN, AN, glass, diamond, CVD diamond, diamond-like carbon (DLC), spinel ($MgAl_2O_3$), $SiO_x$, or $LiGaO_2$.

The first conductivity type semiconductor layer 124, 224, 324, 424, 524, 1220 and the second conductivity type semiconductor layer 120, 220, 1240, 320, 420, 520 are different in electricity, polarity or dopant, or are different semiconductor materials used for providing electrons and holes, wherein the semiconductor material can be single semiconductor material layer or multiple semiconductor material layers. The polarity can be chosen from any two of p-type, n-type and i-type. The active layer 220, 1240, 320, 420, 520 where the electrical energy and the light energy can be converted or stimulated converted is disposed between the first conductivity type semiconductor layer 124, 224, 324, 424, 524, 1220 and the second conductivity type semiconductor layer 120, 220, 1240, 320, 420, 520 respectively The devices which can convert or stimulated convert the electrical energy into the light energy can be light-emitting diodes, liquid crystal displays, and organic light-emitting diodes. The devices which can convert or stimulated convert the light energy into the electrical energy can be solar cells and photodiodes. The material of the first conductivity type semiconductor layer 124, 224, 324, 424, 524, 1220, the active layer 122, 222, 322, 422, 522, 1230 and the second conductivity type semiconductor layer 120, 220,

1240, 320, 420, 520 comprises one element selected from the group consisting of Ga, Al, In, As, P, N, Si, and the combinations thereof.

The optoelectronic device of another embodiment in the application is a light-emitting diode, of which the light spectrum can be adjusted by changing the essentially physical or chemical factor of the single semiconductor material layer or the multiple semiconductor material layers. The material of the single semiconductor material layer or the multiple semiconductor material layers can contain elements selected from the group consisting of Al, Ga, In, P, N, Zn, O, or the combinations thereof. The structure of the active layer (not illustrated) can be a single heterostructure (SH), a double heterostructure (DH), a double-side double heterostructure (DDH) or multi-quantum well (MQW), wherein the wavelength of the light emitted from the active layer (not illustrated) can be changed by adjusting the number of the pairs of MQW.

In one embodiment of the application, a buffer layer (not illustrated) can be selectively disposed between the first conductivity type semiconductor layer 124, 224, 324, 424, 524, 1220 and the substrate 10, 20, 36, 46, 50, 1210. The buffer layer is between the two material systems to transit the material system of the substrate 10, 20, 36, 46, 50, 1210 to the material system of the first conductivity type semiconductor layer 124, 224, 324, 424, 524, 1220. For the structure of the light-emitting diode, the buffer layer is used to reduce the crystal mismatch between two materials. On the other hand, the buffer layer comprises a single layer, multiple layers or a structure which comprises two materials or two separated structures. The material of the buffer layer can be selected from organic material, inorganic material, metal or semiconductor material. The structure of the buffer layer can be a reflector layer, a thermally conductive layer, an electrically conductive layer, an ohmic contact layer, an anti-deformation layer, a stress release layer, a bonding layer, a wavelength conversion layer or a mechanically fixing structure. In one embodiment, the material of the buffer layer can be AlN or GaN, and the buffer layer can be formed by sputtering or atomic layer deposition (ALD).

In the aforementioned embodiments, the first transparent conductive oxide layer 14 and 24, the second transparent conductive oxide layer 28, 48, 58, can comprise indium tin oxide (ITO), cadmium tin oxide (CTO), antimony tin oxide, zinc indium oxide, aluminum zinc oxide, zinc antimony oxide, or the combinations thereof; and can be formed by E-beam evaporation method, ion-sputtering method, thermal-evaporation method, or any combination thereof. Taking ITO as an example, the thickness of the first transparent conductive oxide layer 14 and 24, of the second transparent conductive oxide layer 28, 48, 58, is from 1 μm to 50 λm, and the transmissivity of the first transparent conductive oxide layer 14 and 24, of the second transparent conductive oxide layer 28, 48, 58 is greater than 50% when the range of the related wavelength is from 300 nm to 700 nm.

In the aforementioned embodiments, the metal bonding layer 41, 51 is made of indium (In), tin (Sn), gold-tin (AuSn), or the combinations thereof.

The DBR layer 38 comprises stacked semiconductor layers. The reflective layers 49, 59 comprises In, Sn, Ai, Au, Pt, Zn, Ag, Ti, Pb, Pd, Ge, Cu, AuBe, AuGe, Ni, PbSn, AuZn, or the combinations thereof. The first and second reflective metal layers 17, 27, 30, comprise Al or Ag.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. A light-emitting device comprising:
a light-emitting stacked layer comprising a first conductivity type semiconductor layer; a light-emitting layer formed on the first conductivity type semiconductor layer; and a second conductivity type semiconductor layer formed on the light-emitting layer and comprising a first plurality of cavities such that an upper surface of the second conductivity type semiconductor layer is a textured surface;
a first dielectric layer formed on a first part of the second conductivity type semiconductor layer;
a first transparent conductive oxide layer formed on the first dielectric layer and on a second part of the second conductivity type semiconductor layer, the first transparent conductive oxide layer including a first portion in contact with the first dielectric layer and including a second portion in contact with the upper surface of the second conductivity type semiconductor layer;
a first electrode formed on the first portion of the first transparent conductive oxide layer; and
a first reflective metal layer formed between the first transparent conductive oxide layer and the first electrode.

2. The light-emitting device according to claim 1, wherein the first transparent conductive oxide layer further comprises a second plurality of cavities such that an upper surface of the second portion of the first transparent conductive oxide layer is a textured surface.

3. The light-emitting device according to claim 2, wherein the first plurality of cavities and the second plurality of cavities are shaped into cones or pyramids.

4. The light-emitting device according to claim 1, further comprising a substrate formed below the light-emitting stacked layer.

5. The light-emitting device according to claim 4, further comprising a bonding layer formed between the light-emitting stacked layer and the substrate.

6. The light-emitting device according to claim 5, further comprising a third transparent conductive oxide layer formed between the light-emitting stacked layer and the bonding layer.

7. The light-emitting device according to claim 1, wherein the material of the first transparent conductive oxide layer is selected form the group consisting of indium tin oxide (ITO), cadmium tin oxide (CTO), antimony tin oxide, zinc indium oxide, aluminum zinc oxide, zinc antimony oxide, and the combinations thereof.

8. The light-emitting device according to claim 1, wherein the first dielectric layer comprises $SiO_2$.

9. The light-emitting device according to claim 1, further comprising a Distributed Bragg Reflector (DBR) layer below the light-emitting stacked layer.

10. The light-emitting device according to claim 1, wherein the material of the light-emitting stacked layer contains one or more elements selected from the group consisting of Ga, Al, In, As, P, N and Si.

11. The light-emitting device according to claim 1, wherein the area of the first reflective metal layer is substantially the same as the area of the first electrode.

12. A light-emitting device comprising:
a light-emitting stacked layer comprising a first conductivity type semiconductor layer; a light-emitting layer formed on the first conductivity type semiconductor layer; and a second conductivity type semiconductor layer formed on the light-emitting layer and comprising a first plurality of cavities such that an upper surface of the second conductivity type semiconductor layer is a textured surface;
a first dielectric layer formed on a first part of the second conductivity type semiconductor layer;
a first transparent conductive oxide layer formed on the first dielectric layer and on a second part of the second conductivity type semiconductor layer, the first transparent conductive oxide layer including a first portion in contact with the first dielectric layer and including a second portion in contact with the second conductivity type semiconductor layer; and
a first electrode formed on the first portion of the first transparent conductive oxide layer, wherein the first transparent conductive oxide layer further has a secondary branch not covered by the first electrode and extending toward an end of the light emitting device.

13. The light-emitting device according to claim 12, wherein the first transparent conductive oxide layer further has a third class branch extending from the secondary branch and not covered by the first electrode.

14. A light-emitting device comprising:
a light-emitting stacked layer comprising a first conductivity type semiconductor layer comprising a third plurality of cavities such that an upper surface of the first conductivity type semiconductor layer is a textured surface; a light-emitting layer formed on the first conductivity type semiconductor layer; and a second conductivity type semiconductor layer formed on the light-emitting layer and comprising a first plurality of cavities such that an upper surface of the second conductivity type semiconductor layer is a textured surface;
a first dielectric layer formed on a first part of the second conductivity type semiconductor layer;
a first transparent conductive oxide layer formed on the first dielectric layer and on a second part of the second conductivity type semiconductor layer, first transparent conductive oxide layer including a first portion in contact with the first dielectric layer and including a second portion in contact with the second conductivity type semiconductor layer;
a first electrode formed on the first portion of the first transparent conductive oxide layer; and
a second dielectric layer formed on a first part of an upper surface of the first conductivity type semiconductor layer; and
a second transparent conductive oxide layer formed on the second dielectric layer and on a second part of the first conductivity type semiconductor layer, the second transparent conductive oxide layer including a first portion in contact with the second dielectric layer and including a second portion in contact with the first conductivity type semiconductor layer.

15. The light-emitting device according to claim 14, wherein the second dielectric layer comprises $SiO_2$.

16. The light-emitting device according to claim 15, wherein the second transparent conductive oxide layer further comprises a fourth plurality of cavities such that an upper surface of the second portion of the second transparent conductive oxide layer is a textured surface.

17. The light-emitting device according to claim 16, wherein the third plurality of cavities and the fourth plurality of cavities are shaped into cones or pyramids.

18. The light-emitting device according to claim 14, further comprising a second electrode formed on the first portion of the second transparent conductive oxide layer.

19. The light-emitting device according to claim 18, further comprising a second reflective metal layer formed between the second electrode and the second transparent conductive oxide layer.

20. The light-emitting device according to claim 14, further comprising a Distributed Bragg Reflector (DBR) layer below the light-emitting stacked layer.

* * * * *